US011296167B2

(12) United States Patent
Koo et al.

(10) Patent No.: US 11,296,167 B2
(45) Date of Patent: Apr. 5, 2022

(54) DISPLAY DEVICE

(71) Applicant: Samsung Display Co., Ltd., Yongin-si (KR)

(72) Inventors: Dongseong Koo, Yongin-si (KR); Dongwook Kang, Yongin-si (KR); Kyunghan Kim, Yongin-si (KR); Ikjoong Seong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 16/907,684

(22) Filed: Jun. 22, 2020

(65) Prior Publication Data
US 2021/0126060 A1     Apr. 29, 2021

(30) Foreign Application Priority Data

Oct. 24, 2019 (KR) .................. 10-2019-0133261

(51) Int. Cl.
*H01L 27/32* (2006.01)
*H01L 51/52* (2006.01)
*H01L 51/50* (2006.01)

(52) U.S. Cl.
CPC ........ *H01L 27/326* (2013.01); *H01L 51/5056* (2013.01); *H01L 51/5072* (2013.01); *H01L 51/5092* (2013.01); *H01L 51/5253* (2013.01); *H01L 2251/301* (2013.01)

(58) Field of Classification Search
CPC .......................... H01L 27/326; H01L 51/5056; H01L 51/5072
See application file for complete search history.

(56) References Cited

U.S. PATENT DOCUMENTS

| | | | |
|---|---|---|---|
| 9,632,487 B2 | 4/2017 | Kim et al. | |
| 9,997,738 B2 | 6/2018 | Choi et al. | |
| 10,332,947 B2 | 6/2019 | Kim et al. | |
| 10,466,822 B2 | 11/2019 | Kim et al. | |
| 2015/0171367 A1 | 6/2015 | Moon | |
| 2017/0237038 A1 | 8/2017 | Kim et al. | |
| 2018/0315809 A1 | 11/2018 | Kim et al. | |
| 2019/0051859 A1 | 2/2019 | Choi et al. | |

(Continued)

FOREIGN PATENT DOCUMENTS

| | | |
|---|---|---|
| EP | 3 486 962 A2 | 5/2019 |
| KR | 10-2015-0071538 A | 6/2015 |
| KR | 10-2017-0015632 A | 2/2017 |

(Continued)

*Primary Examiner* — Anthony Ho
(74) *Attorney, Agent, or Firm* — Lewis Roca Rothgerber Christie LLP

(57) ABSTRACT

A display device includes: a first through hole; a plurality of pixels in a display area around the first through hole; a first layer in a middle area between the first through hole and the display area and including a first hole or a recess; and a second layer on the first layer and including a second hole overlapping the first hole or the recess, and the second layer includes a tip extending towards a center of the second hole further than an internal surface of the first layer that defines the first hole or the recess, each of the plurality of pixels includes a light-emitting diode including a pixel electrode, an opposite electrode, and an intermediate layer between the pixel electrode and the opposite electrode, and at least one organic material layer of the intermediate layer is disconnected at the tip.

25 Claims, 16 Drawing Sheets

(56) References Cited

U.S. PATENT DOCUMENTS

2019/0245159 A1  8/2019  Kim et al.

FOREIGN PATENT DOCUMENTS

| KR | 10-2017-0128742 A | 11/2017 |
| KR | 10-2018-0026599 A | 3/2018 |
| KR | 10-2018-0063633 A | 6/2018 |
| KR | 10-2018-0078801 A | 7/2018 |

DISPLAY DEVICE

CROSS-REFERENCE TO RELATED APPLICATION

This application claims priority to and the benefit of Korean Patent Application No. 10-2019-0133261, filed on Oct. 24, 2019 in the Korean Intellectual Property Office, the entire disclosure of which is incorporated herein by reference.

BACKGROUND

1. Field

Aspects of one or more embodiments relate to a display device.

2. Description of Related Art

Display devices have been used for various purposes. Also, since the thickness and weight of the display devices have been reduced, the utilization range of the display devices has increased.

In a display device, various functions added to or linked to a display device are being added while increasing a display area. As a method of adding various functions while increasing an area, research into a display device having an area for providing other various functions than an image display in a display area has been continuously conducted.

SUMMARY

According to an aspect of one or more embodiments, a display device includes a transmission area, in which components are located, inside a display area.

One or more embodiments include a structure of improving the performance of preventing moisture permeation in a display device having a transmission area. However, the above aspects are provided as examples, and the scope of the present disclosure is not limited thereto.

Additional aspects will be set forth, in part, in the description which follows and, in part, will be apparent from the description, or may be learned by practice of the presented embodiments of the disclosure.

According to one or more embodiments, a display device includes: a first through hole; a plurality of pixels in a display area around the first through hole, the plurality of pixels including two pixels spaced from one another with the first through hole therebetween; a first layer in a middle area between the first through hole and the display area, the first layer including a first hole or a recess; and a second layer on the first layer, the second layer including a second hole overlapping the first hole or the recess, wherein the second layer includes a tip extending towards a center of the second hole further than an internal surface of the first layer, the internal surface defining the first hole or the recess, each of the plurality of pixels includes a light-emitting diode including a pixel electrode, an opposite electrode, and an intermediate layer between the pixel electrode and the opposite electrode, and at least one organic material layer of the intermediate layer is disconnected at the tip.

The at least one organic material layer may include one or more selected from a hole transport layer, a hole injection layer, an electron injection layer, and an electron transport layer.

The opposite electrode may be disconnected at the tip.

The first layer may include an organic insulating material, and the second layer may include a metal.

The display device may further include a substrate on which the plurality of pixels is arranged, and at least one inorganic insulating layer between the substrate and the pixel electrode.

The first layer may be on the at least one inorganic insulating layer, and the second layer may be in direct contact with an upper surface of the at least one inorganic insulating layer beyond the first layer.

The display device may further include at least one organic insulating layer between the at least one inorganic insulating layer and the pixel electrode, and the first layer may include a same material as a material included in the at least one organic insulating layer.

A portion of the substrate may be bent about a bending axis extending along a bending area, and the at least one inorganic insulating layer may include an opening in the bending area.

The display device may further include an organic insulating layer in the opening of the at least one inorganic insulating layer, and the first layer may include a same material as a material included in the organic insulating layer.

The display device may further include an inorganic passivation layer on the second layer.

The inorganic passivation layer may continuously cover a side surface and a bottom surface of the second layer and an internal surface of the first layer.

According to one or more embodiments, a display device includes: a substrate; a display layer on the substrate, the display layer including a plurality of pixels; a thin film encapsulation layer on the display layer, the thin film encapsulation layer including at least one inorganic encapsulation layer and at least one organic encapsulation layer; a first through hole between two neighboring pixels from among the plurality of pixels, the first through hole penetrating through the substrate, the display layer, and the thin film encapsulation layer; and a first groove around the first through hole, the first groove being defined in a first layer and a second layer on the first layer, wherein the first groove includes a first hole or a recess in the first layer and a second hole in the second layer, the second layer includes a tip extending towards a center of the second hole further than an internal surface of the first layer, the internal surface defining the first hole or the recess, and at least one organic material layer in the display layer is disconnected at the first groove.

Each of the plurality of pixels may include a light-emitting diode including a pixel electrode, an opposite electrode, and an emission layer between the pixel electrode and the opposite electrode, and the at least one organic material layer may be between the pixel electrode and the opposite electrode.

The at least one organic material layer may include one or more selected from a hole transport layer, a hole injection layer, an electron injection layer, and an electron transport layer.

The display layer may include at least one inorganic insulating layer between the substrate and the pixel electrode, and the first layer may be on the at least one inorganic insulating layer.

The first layer may include an organic insulating material.

The second layer may be in direct contact with an upper surface of the at least one inorganic insulating layer beyond the first layer.

The second layer may include a metal or an inorganic insulating material.

The display device may further include an inorganic passivation layer on the second layer.

The inorganic passivation layer may continuously cover a side surface and a bottom surface of the second layer and an internal surface of the first layer.

A portion of the substrate may be bent about a bending axis extending along a bending area, and the at least one inorganic insulating layer may include an opening in the bending area.

The display device may further include an organic insulating layer in the opening of the at least one inorganic insulating layer, and the first layer may include a same material as a material included in the organic insulating layer.

The display device may further include a second groove around the first through hole, and a barrier wall between the first groove and the second groove.

The barrier wall may include a plurality of barrier wall layers that are stacked, and a gap layer may be between two neighboring barrier wall layers among the plurality of barrier wall layers, the gap layer including a metal.

The gap layer may include a first layer and a second layer under the first layer, the first layer having an edge protruding outward more than an edge of the second layer, and the at least one organic material layer may be disconnected at an eave structure formed by the edge of the first layer and the edge of the second layer.

Other aspects, features, and advantages of the present disclosure will become better understood through the accompanying drawings, the claims, and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
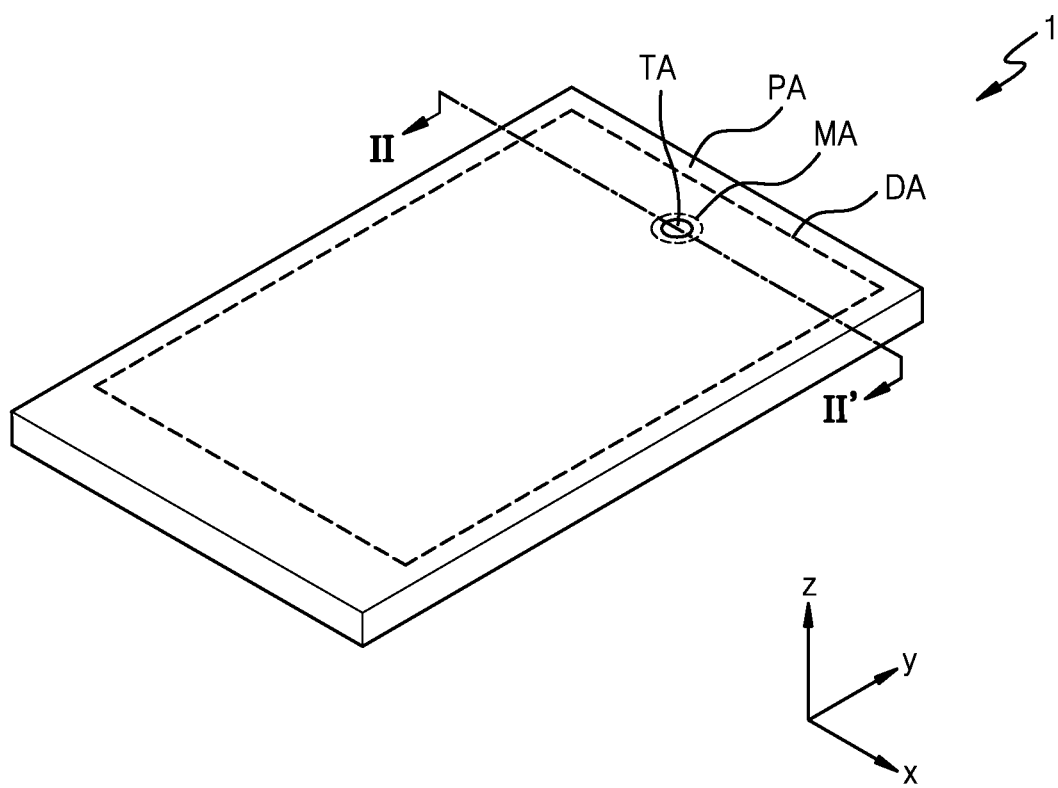
FIG. 1 is a perspective view of a display device according to an embodiment.

Reference will now be made in further detail to embodiments, some examples of which are illustrated in the accompanying drawings, wherein like reference numerals refer to like elements throughout. In this regard, the present embodiments may have different forms and should not be construed as being limited to the descriptions set forth herein. Accordingly, some example embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Some example embodiments will be described below in further detail with reference to the accompanying drawings. Those components that are the same or are in correspondence are provided the same reference numeral regardless of the figure, and redundant explanations may be omitted.

While such terms as "first," "second," etc., may be used to describe various components, such components are not to be limited by the above terms. The above terms are used to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, but are not intended to preclude the possibility that one or more other features, numbers, steps, actions, components, parts, or combinations thereof may exist or may be added.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes of components in the drawings may be exaggerated for convenience of explanation. In other words, since sizes and thicknesses of components in the drawings may be arbitrarily illustrated for convenience of explanation, the embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, elements, or the like are referred to as being "connected," it is to be understood that they may be directly connected or one or more intervening portions may be present between layers, areas, elements, or the like. For example, when layers, areas, elements, or the like are referred to as being "electrically connected," they may be directly electrically connected, or layers, areas, elements, or the like may be indirectly electrically connected and one or more intervening portions may be present.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device 1 according to an embodiment.

Referring to FIG. 1, the display device 1 may include a display area DA and a peripheral area PA around (e.g., surrounding) the display area DA. A transmission area TA and a middle area MA around (e.g., surrounding) the transmission area TA may be inside the display area DA.

A plurality of pixels, e.g., an array of pixels, may be in the display area DA. The display area DA may display an image via the array of pixels. The display area DA corresponds to an active area displaying images. In an embodiment, the display area DA may entirely surround the transmission area TA.

A component that may provide any of various functions to the display device 1 may be in the transmission area TA. For example, when the component includes a sensor, a camera, etc. that uses light, the light emitted from or proceeding to the sensor or the light proceeding towards the camera may pass through the transmission area TA.

The middle area MA is between the transmission area TA and the display area DA and may be around (e.g., surround) the transmission area TA. The middle area MA may be a kind of non-display area in which pixels are not located. Lines configured to provide a signal or a voltage (e.g., a predetermined signal or a voltage) to pixels adjacent to the transmission area TA may be in the middle area MA. A groove that will be described later may be in the middle area MA.

The peripheral area PA may be a kind of non-display area in which pixels are not located, like the middle area MA. Various kinds of lines, circuits, etc. may be in the peripheral area PA.

In an embodiment, each of the pixels in the display device 1 may include a light-emitting diode as a display element emitting light of a certain color (e.g., a predetermined color). In an embodiment, the light-emitting diode may include an organic light-emitting diode including an organic material as an emission layer. In another embodiment, the light-emitting diode may include an inorganic light-emitting diode. In another embodiment, the light-emitting diode may include quantum dots as an emission layer. Herein, a case in which the light-emitting diode includes an organic light-emitting diode will be described for convenience of description.

FIG. 1 shows that the transmission area TA is at a center of the display area DA in a width direction (e.g., a ±x direction) of the display device 1, but embodiments are not limited thereto. In another embodiment, the transmission area TA may be biased to the left or right side in the width direction of the display device 1. In another embodiment, the transmission area TA may be at any of various locations, e.g., an upper side, an intermediate side, or a lower side in a lengthwise direction (e.g., a ±y direction) of the display device 1.

FIG. 1 shows that the display device 1 may include one transmission area TA, but, in another embodiment, the display device 1 may include a plurality of transmission areas TA.

Figure 2:
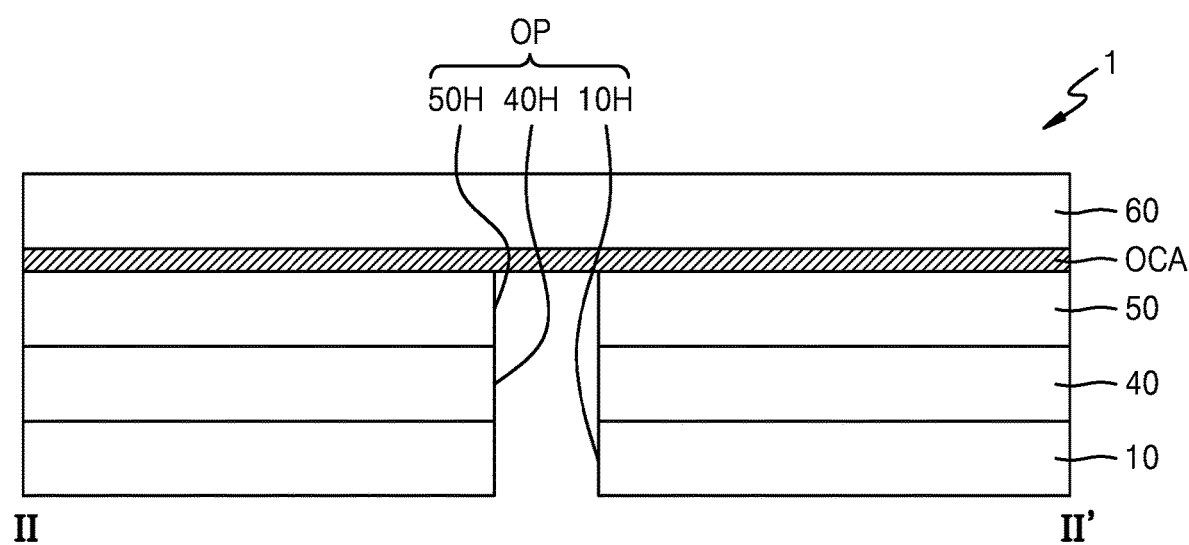
FIG. 2 is a cross-sectional view of a display device according to an embodiment, taken along the line II-II' of FIG. 1.
Figure 2:
Figure 2:
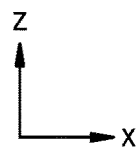
Figure 3:
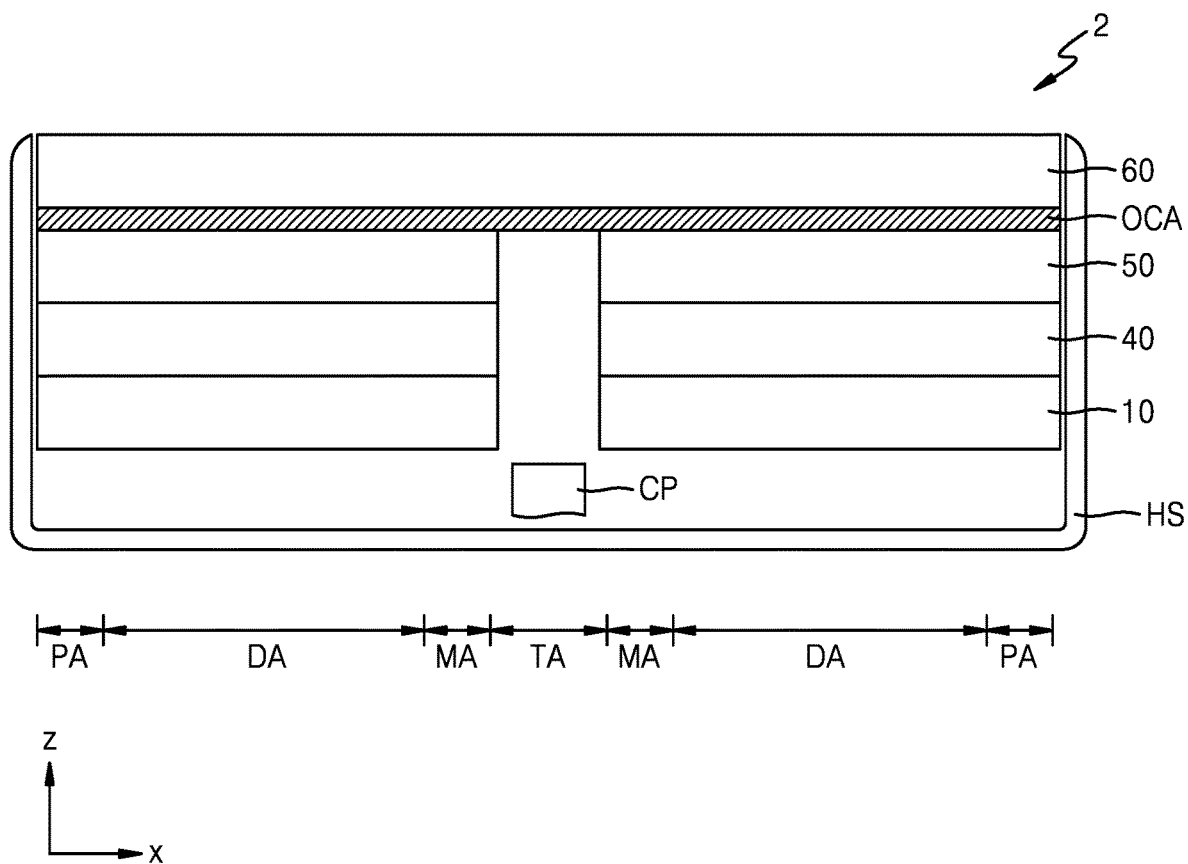
FIG. 3 is a cross-sectional view of an electronic device including a display device according to an embodiment.

FIG. 2 is a cross-sectional view of the display device 1, taken along the line II-II' of FIG. 1; and FIG. 3 is a cross-sectional view of an electronic device including the display device 1 according to an embodiment.

Referring to FIG. 2, in an embodiment, the display device 1 may include a display panel 10, and an input sensing section 40 and an optical functional section 50 that are on an upper surface of the display panel 10. In an embodiment, a window 60 may be bonded to an element thereunder, e.g., the optical functional section 50, via an optical clear adhesive (OCA), for example.

The display panel 10 may include a plurality of light-emitting diodes in the display area DA. The display panel 10 may include lines for providing a signal or a voltage to each of the plurality of light-emitting diodes (e.g., a data line, a scan line, a driving voltage line, a common voltage line, etc.) and transistors electrically connected respectively to the plurality of light-emitting diodes.

The input sensing section 40 may obtain coordinate information according to an external input, e.g., a touch event. The input sensing section 40 may include touch electrodes and trace lines connected to the touch electrodes. The input sensing section 40 may be on the display panel 10. The input sensing section 40 may sense an external input by a mutual capacitance method or a self-capacitance method.

In an embodiment, the input sensing section 40 may be directly on the display panel 10. In another embodiment, the input sensing section 40 may be separately manufactured and coupled to the display panel 10 via an adhesive layer, such as an OCA. In an embodiment, as shown in FIG. 2, the input sensing section 40 may be directly on the display panel 10, and, in this case, the adhesive layer may not be between the input sensing section 40 and the display panel 10.

In an embodiment, the optical functional section 50 may include an anti-reflection layer. The anti-reflection layer may reduce a reflectivity of light incident to the display panel 10 from outside (external light) via the window 60. In an embodiment, the anti-reflection layer may include a retarder and a polarizer. The retarder may be of a film type or a liquid crystal coating type and may include a λ/2 retarder and/or a λ/4 retarder. The polarizer may be of a film type or a liquid crystal coating type. The film-type polarizer may include a stretched synthetic resin film, and the liquid crystal coating-type polarizer may include liquid crystals arranged in a certain orientation. The retarder and the polarizer may further include a protective film.

In another embodiment, the anti-reflection layer may include a structure including a black matrix and color filters. The color filters may be arranged taking into account a color of light emitted from each of the pixels in the display panel 10. In another embodiment, the anti-reflection layer may include a destructive interference structure. The destructive interference structure may include a first reflective layer and a second reflective layer arranged on different layers. First reflected light and second reflected light that are respectively reflected by the first reflective layer and the second reflective layer may destructively interfere with each other, and, accordingly, a reflectivity of external light may be reduced.

In an embodiment, the optical functional section 50 may include a lens layer. The lens layer may improve the light-emitting efficiency of light emitted from the display panel 10 or may reduce a color difference. The lens layer may include a layer having a concave or a convex lens shape and/or may include a plurality of layers having different refractive indices. The optical functional section 50 may include both the anti-reflection layer and the lens layer or may include either the anti-reflection layer or the lens layer.

Referring to FIG. 3, the display device 1 may be included in an electronic device 2 of various types, e.g., a mobile phone, a tablet PC, a laptop computer, a smart watch, etc. The electronic device 2 includes a housing HS having an internal space, and the display panel 10 may be in the housing HS. The window 60 may be coupled to the housing HS. The input sensing section 40 and the optical functional section 50 are on the upper surface of the display panel 10 as described above.

A component CP is in the housing HS and may be located between the display panel 10 and an internal bottom surface of the housing HS. The component CP may be in the transmission area TA. The transmission area TA may be referred to as a component area in which the component CP is located.

The component CP may include an electronic element. For example, the component CP may be an electronic element using light. For example, the electronic element may include a light-receiving sensor, such as an infrared-ray sensor, a camera capturing an image by receiving light, a sensor for outputting and sensing light to measure a distance or recognize a fingerprint, a small-sized lamp illuminating light, etc.

The electronic element using light may use light of various wavelength bands, such as visible light, infrared rays, ultraviolet rays, etc. In an embodiment, when the component CP includes a camera, a transmittance of the display device 1 in the transmission area TA may be about 70% or greater. In another embodiment, when the component CP includes a sensor, the transmittance of the display device 1 in the transmission area TA may be less than 70%, e.g., about 50% or greater, or 60% or greater.

In an embodiment, to prevent or substantially prevent the transmittance from degrading due to the elements on a proceeding path of light emitted from the component CP or proceeding towards the component CP, the display device 1 (see FIG. 2) may include an opening OP. The opening OP may be manufactured by partially removing at least one of the elements included in the display device 1, e.g., the display panel 10, the input sensing section 40, the optical functional section 50, and the window 60. In an embodiment, FIG. 2 shows that the display panel 10, the input sensing section 40, and the optical functional section 50 respectively include first to third through holes 10H, 40H, and 50H that define the opening OP.

Referring to FIG. 2, the display panel 10 includes the first through hole 10H passing from an upper surface to a bottom surface of the display panel 10, the input sensing section 40 includes the second through hole 40H passing from an upper surface to a bottom surface of the input sensing section 40, and the optical functional section 50 includes the third through hole 50H passing from an upper surface to a bottom surface of the optical functional section 50. The first to third through holes 10H, 40H, and 50H are in the transmission area TA and may overlap one another.

Figure 4:
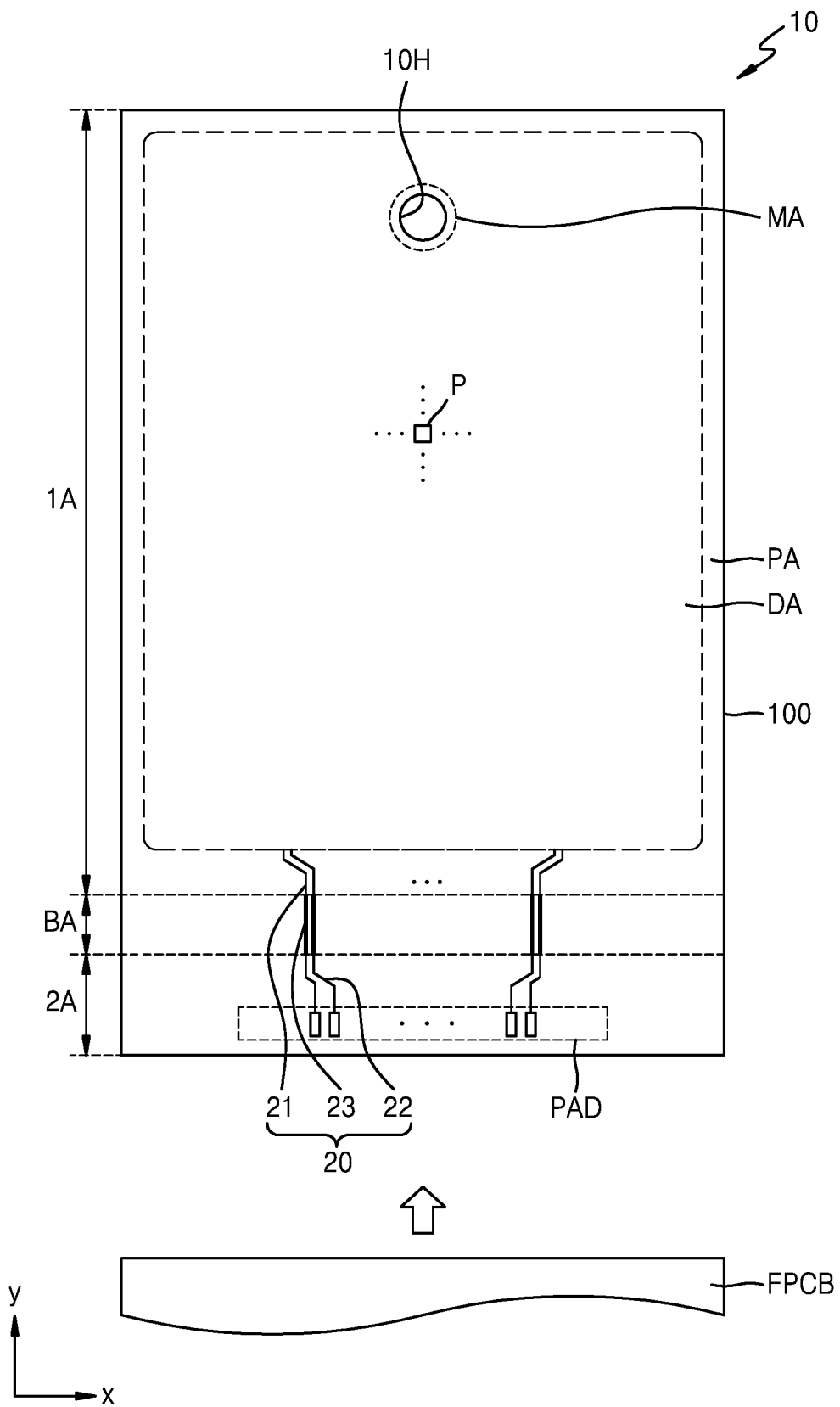
FIG. 4 is a plan view of a display panel according to an embodiment.
Figure 5:
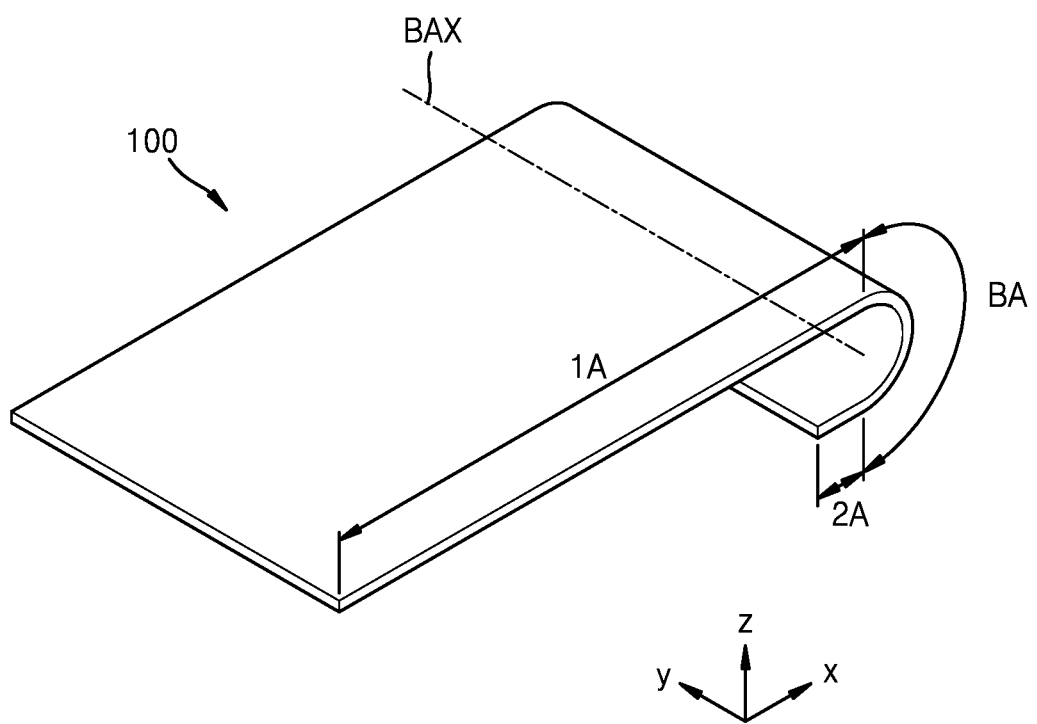
FIG. 5 is a perspective view of a substrate in a display panel according to an embodiment.

FIG. 4 is a plan view of the display panel 10 according to an embodiment; and FIG. 5 is a perspective view of a substrate 100 in the display panel 10 according to an embodiment.

Referring to FIG. 4, the display panel 10 includes pixels P on the substrate 100. The pixels P are in the display area DA to provide images. Each of the pixels P may include a display element, e.g., a light-emitting diode that may emit light of a certain color.

The first through hole 10H may be in the display area DA. Since the first through hole 10H is in the display area DA, the pixels P may be at opposite sides of the first through hole 10H. For example, the first through hole 10H may be between two neighboring pixels P.

The middle area MA may have a certain area around (e.g., surrounding) the first through hole 10H. Lines (e.g., a data line, a scan line, a driving voltage line, etc.) configured to apply signals or voltages to the pixels around the first through hole 10H may be partially in the middle area MA. The middle area MA may include a groove that is a structure for preventing or substantially preventing moisture infiltration, as described later.

The peripheral area PA may be around (e.g., surround) the display area DA. A scan driver, a data driver, etc. may be in the peripheral area PA. A pad PAD may be in the peripheral area PA. The pad PAD may be adjacent to an edge of the substrate 100. In an embodiment, the pad PAD is not covered by an insulating layer, but is exposed and electrically connected to a flexible printed circuit board FPCB. The flexible printed circuit board FPCB electrically connects a controller to the pad PAD and may supply to the pad PAD a signal or electric power transferred from the controller. In some embodiments, a data driver may be in the flexible printed circuit board FPCB. In order to transfer a signal or a voltage in the flexible printed circuit board FPCB to the pixels P, the pad PAD may be connected to a plurality of lines 20.

In an embodiment, the peripheral area PA may include a bending area BA. The bending area BA may be between the pad PAD and the display area DA. The bending area BA may extend in a direction intersecting with a direction in which the lines 20 extend. The bending area BA may extend in a direction in parallel with an edge of the substrate 100. The substrate 100 may include or be partitioned into a first area 1A including the display area DA and a second area 2A opposite to the first area 1A, based on the bending area BA. The bending area BA is between the first area 1A and the second area 2A. The first area 1A includes some portions of the display area DA and the peripheral area PA, and the second area 2A may only include a portion of the peripheral area PA.

The display panel 10 may be bent about the bending area BA. In this regard, FIG. 5 shows that the substrate 100 of the display panel 10 is bent. The substrate 100 is bent about a bending axis BAX that extends in a y-direction, and, thus, the display panel 10 may also be bent like the substrate 100. The substrate 100 may include any of various materials (e.g., a polymer resin) that are flexible or bendable. FIG. 5 illustrates that the substrate 100 is bent, but layers on the substrate 100 included in the display panel 10 may also be bent with the substrate 100.

As shown in FIG. 4, each of the lines 20 may include a first portion 21 and a second portion 22 at opposite sides of the bending area BA, and a third portion 23 connecting the first portion 21 and the second portion 22. The first portion 21 is between the display area DA and the bending area BA, the second portion 22 may be between the bending area BA and the pad PAD, and the third portion 23 may be in the bending area BA.

When the substrate 100 is bent about the bending axis BAX, the lines 20 may be disconnected or layers on and/or under the lines 20 may be exfoliated. To prevent or substantially prevent this, as described above, the line 20 includes the first portion 21 and the second portion 22 that are apart from each other with the bending area BA therebetween, and the first portion 21 and the second portion 22 may be connected to each other via the third portion 23 including a material having relatively high flexibility.

Figure 6:
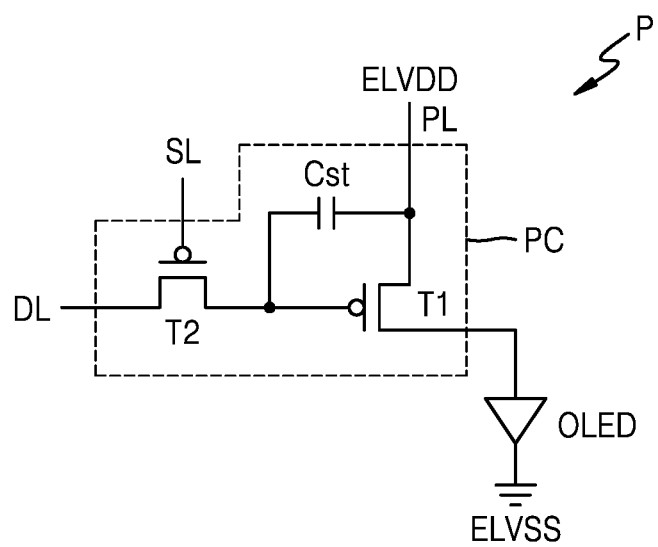
FIG. 6 is an equivalent circuit diagram of a pixel in a display panel according to an embodiment.

FIG. 6 is an equivalent circuit diagram of a pixel P in a display panel according to an embodiment.

Referring to FIG. 6, the light-emitting diode, e.g., an organic light-emitting diode OLED, may be connected to a pixel circuit PC. The pixel circuit PC may include a first thin film transistor T1, a second thin film transistor T2, and a storage capacitor Cst. Each of the pixels P may emit light, e.g., red light, green light, blue light, or white light, from the organic light-emitting diode OLED.

The second thin film transistor T2 is a switching thin film transistor and is connected to a scan line SL and a data line DL, and may configured to transfer a data voltage input from the data line DL to the first thin film transistor T1 based on a switching voltage input from the scan line SL. The storage capacitor Cst is connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor connected to the driving voltage line PL and the storage capacitor Cst and may control a driving current flowing in the organic light-emitting diode OLED from the driving voltage line PL, corresponding to the voltage value stored in the storage capacitor Cst. The organic light-emitting diode OLED may emit light having a certain luminance according to the driving current. An opposite electrode (e.g., a cathode) of the organic light-emitting diode OLED may receive supply of a second power voltage ELVSS.

FIG. 6 illustrates that the pixel circuit PC includes two thin film transistors and one storage capacitor, but embodiments are not limited thereto. The number of thin film transistors and the number of storage capacitors may vary depending on a design of the pixel circuit PC. For example, the pixel circuit PC may include four or more thin film transistors, in addition to the two thin film transistors described above.

Figure 7:
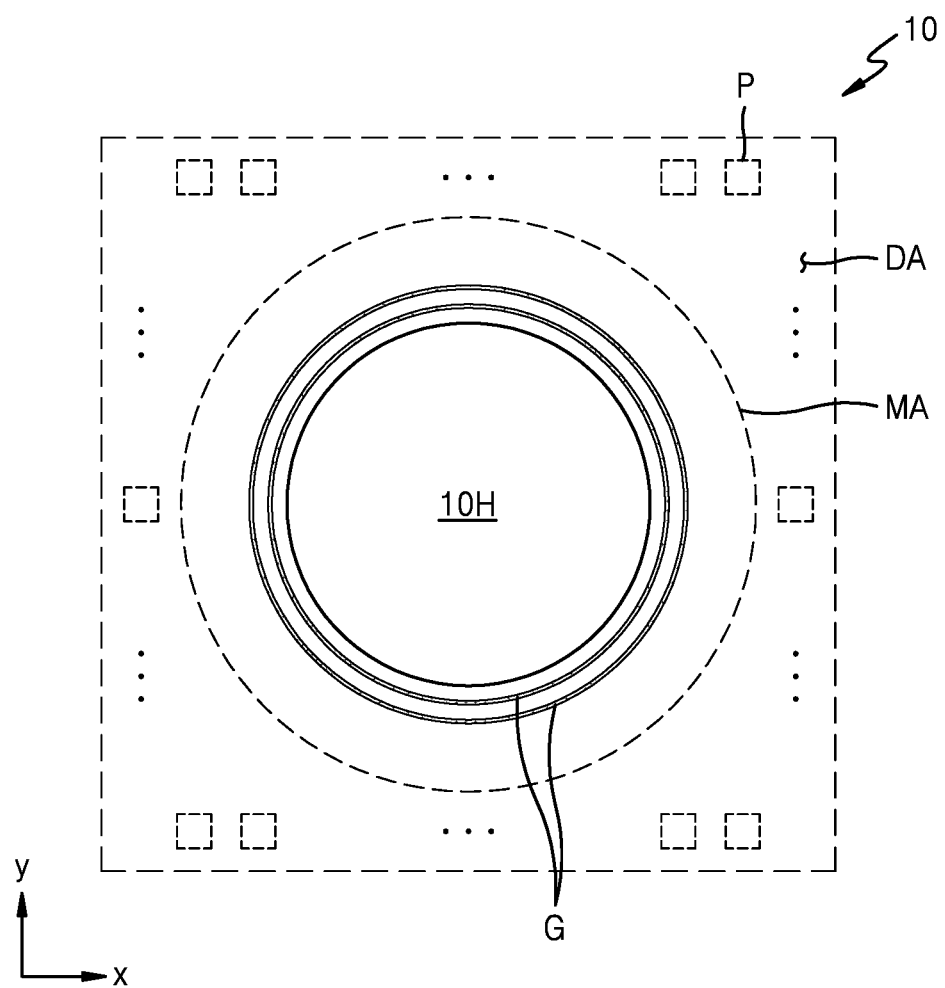
FIG. 7 is a plan view partially showing a display panel according to an embodiment.

FIG. 7 is a plan view partially showing the display panel 10 according to an embodiment.

Referring to FIG. 7, the pixels P are in the display area DA, and the first through hole 10H may be defined between adjacent pixels P. For example, in a plan view, the pixels P are above and under the first through hole 10H and at left and right sides of the first through hole 10H.

One or more grooves G may be in the middle area MA to prevent or substantially prevent infiltration of moisture through the first through hole 10H and damage to the light-emitting diode in the pixel P. In an embodiment, a plurality of grooves G may be provided as concentric circles. The plurality of grooves G may be apart from one another. FIG. 7 shows two grooves G, but three or more grooves G may be provided.

Figure 8:
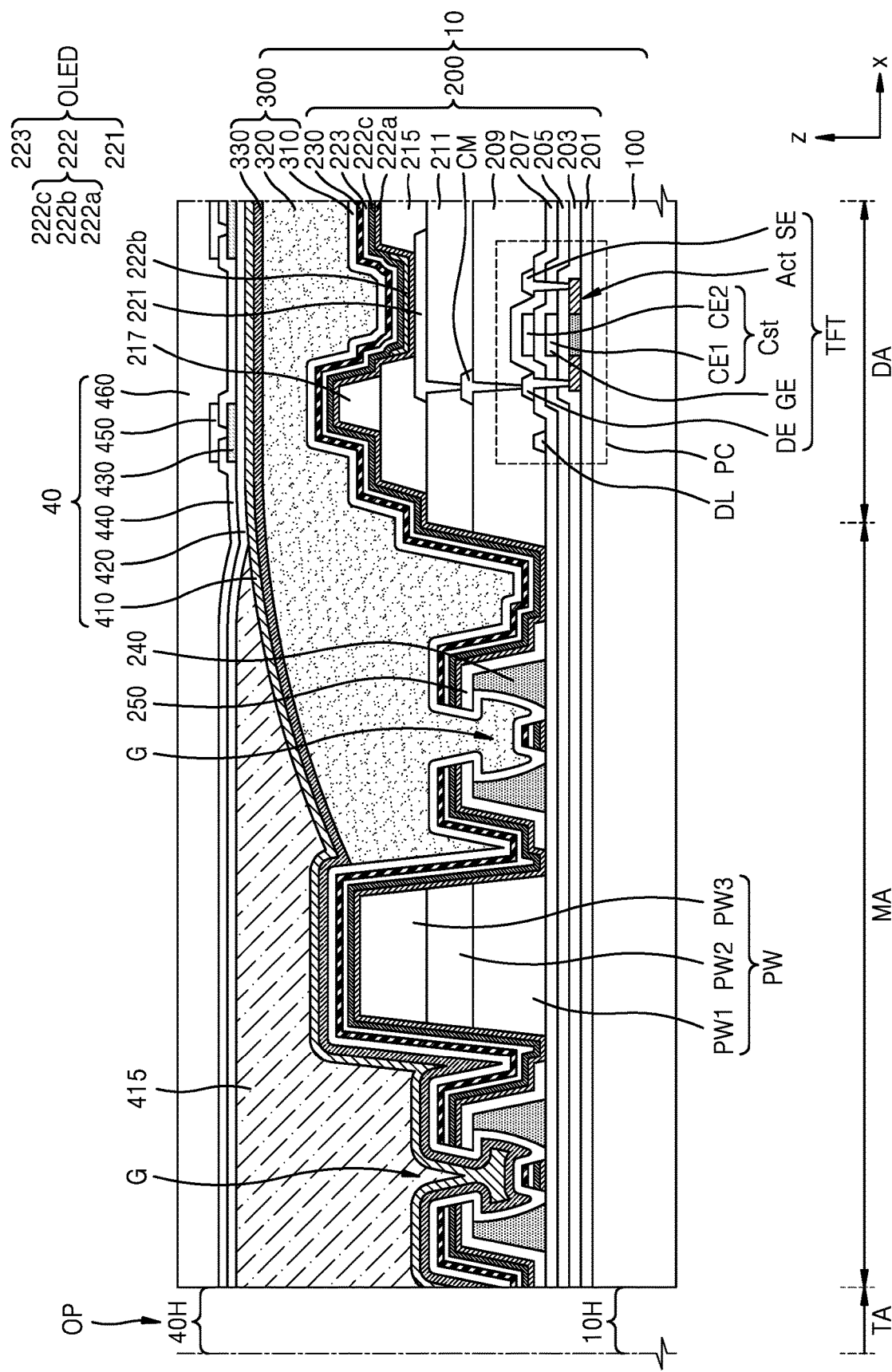
FIG. 8 is a cross-sectional view of a display device according to an embodiment.
Figure 9:
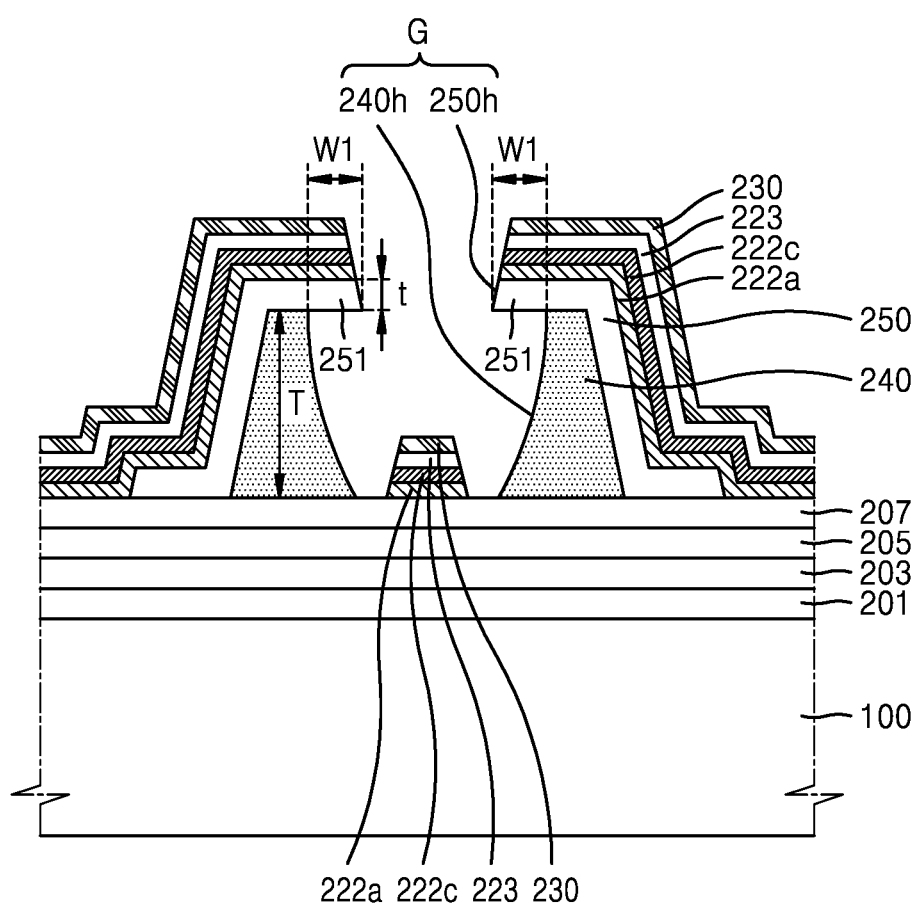
FIGS. 9 and 10 are cross-sectional views of a groove structure according to some embodiments.
Figure 10:
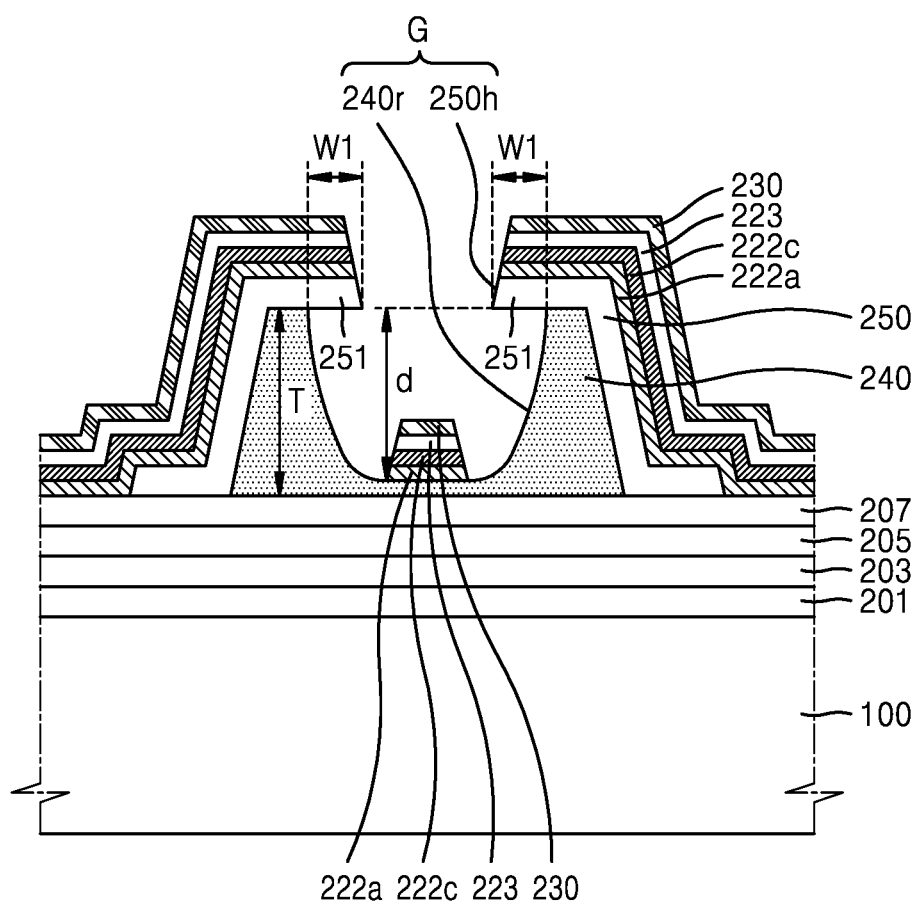

FIG. 8 is a cross-sectional view of a display device according to an embodiment; and FIGS. 9 and 10 are cross-sectional views each showing a groove structure according to an embodiment. In FIG. 8, the display panel 10 and a touch sensing portion in the display device are shown, and the optical functional section is omitted for convenience of description.

Referring to FIG. 8, the display panel 10 including the substrate 100, a display layer 200 including arrays of a plurality of pixels, and a thin film encapsulation layer 300 includes the first through hole 10H corresponding to the transmission area TA, and the input sensing section 40 on the display panel 10 includes the second through hole 40H corresponding to the transmission area TA. The first through hole 10H may penetrate through the substrate 100, the display layer 200, and the thin film encapsulation layer 300. The first through hole 10H and the second through hole 40H overlap each other and configure the opening OP described above with reference to FIG. 2.

Referring to the display area DA in FIG. 8, the substrate 100 may include a polymer resin. In an embodiment, the substrate 100 may include a base layer including a polymer resin and an inorganic insulating layer on the base layer. For example, the substrate 100 may include two base layers and the inorganic insulating layer on each base layer. The polymer resin may include any of polyethersulfone, polyarylate, polyether imide, polyethylene naphthalate, polyethylene terephthalate, polyphenylene sulfide, polyimide, polycarbonate, cellulose tri-acetate, cellulose acetate propionate, etc.

A buffer layer 201 may be on the substrate 100 to prevent or substantially prevent impurities from infiltrating into a semiconductor layer Act of a thin film transistor TFT. The buffer layer 201 may include an inorganic insulating material, such as silicon nitride, silicon oxynitride, and/or silicon oxide. The buffer layer 201 may have a single-layered or multi-layered structure including the inorganic insulating material described above.

The pixel circuit PC may be on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE.

The data line DL of the pixel circuit PC is electrically connected to a switching thin film transistor in the pixel circuit PC, although not shown in FIG. 8. In an embodiment, a top gate-type transistor in which the gate electrode GE is over the semiconductor layer Act with a gate insulating layer 203 therebetween is shown, but, in another embodiment, the thin film transistor TFT may be a bottom gate-type transistor.

In an embodiment, the semiconductor layer Act may include polysilicon. In another embodiment, the semiconductor layer Act may include any of amorphous silicon, an oxide semiconductor, an organic semiconductor, etc. The gate electrode GE may include a low-resistive metal material. The gate electrode GE may include a conductive material including any of molybdenum (Mo), aluminum (Al), copper (Cu), titanium (Ti), etc., and may have a single-layered or multi-layered structure including the material described above.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, hafnium oxide, etc. The gate insulating layer 203 may have a single-layered or multi-layered structure including the materials described above.

In an embodiment, the source electrode SE and the drain electrode DE may be at a same layer as that of the data line DL and may include a same material as that of the data line DL. The source electrode SE, the drain electrode DE, and the data line DL may include a highly conductive material. The source electrode SE and the drain electrode DE may include a conductive material including molybdenum (Mo), aluminum (Al), copper (Cu), titanium (Ti), etc., and may have a single-layered or multi-layered structure including the above materials. In an embodiment, the source electrode SE, the drain electrode DE, and the data line DL may have a multi-layered structure including a titanium layer, an aluminum layer, and a titanium layer (Ti/Al/Ti).

The storage capacitor Cst may include a lower electrode CE1 and an upper electrode CE2 overlapping each other with a first interlayer insulating layer 205 therebetween. The storage capacitor Cst may overlap the thin film transistor TFT. Regarding this, FIG. 8 shows a structure in which the gate electrode GE of the thin film transistor TFT is the lower electrode CE1 of the storage capacitor Cst. In another embodiment, the storage capacitor Cst may not overlap the thin film transistor TFT. The storage capacitor Cst may be covered by a second interlayer insulating layer 207. The upper electrode CE2 of the storage capacitor Cst may include a conductive material, such as molybdenum (Mo), aluminum (Al), copper (Cu), titanium (Ti), etc., and may have a single-layered or multi-layered structure including the materials described above.

The first interlayer insulating layer 205 and/or the second interlayer insulating layer 207 may each include an inorganic insulating material, such as silicon oxide, silicon nitride, silicon oxynitride, aluminum oxide, titanium oxide, tantalum oxide, hafnium oxide, etc. The first interlayer insulating layer 205 and the second interlayer insulating layer 207 may each have a single-layered structure or a multi-layered structure including the above-mentioned materials.

The pixel circuit PC including the thin film transistor TFT and the storage capacitor Cst may be covered by a first organic insulating layer 209. The first organic insulating layer 209 may have a flat upper surface.

The pixel circuit PC may be electrically connected to a pixel electrode 221. For example, as shown in FIG. 8, a contact metal layer CM may be arranged between the thin film transistor TFT and the pixel electrode 221. The contact metal layer CM may be connected to the thin film transistor TFT via a contact hole in the first organic insulating layer 209, and the pixel electrode 221 may be connected to the contact metal layer CM via a contact hole in a second organic insulating layer 211 that is on the contact metal layer CM. The contact metal layer CM may include a conductive material including any of molybdenum (Mo), aluminum (Al), copper (Cu), titanium (Ti), etc., and may have a single-layered or multi-layered structure. In an embodiment, the contact metal layer CM may have a multi-layered structure including Ti/Al/Ti.

The first organic insulating layer 209 and/or the second organic insulating layer 211 may include an organic insulating material, such as any of a general polymer (e.g., polymethylmethacrylate (PMMA) or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In an embodiment, the first organic insulating layer 209 and/or the second organic insulating layer 211 may include polyimide.

The pixel electrode 221 may be on the second organic insulating layer 211. The pixel electrode 221 may include a conductive oxide, such as indium tin oxide (ITO), indium zinc oxide (IZO), zinc oxide (ZnO), indium oxide ($In_2O_3$), indium gallium oxide, or aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may further include a transparent conductive oxide material layer including ITO, IZO, ZnO, or $In_2O_3$ on and/or under the reflective layer.

A pixel defining layer 215 may be on the pixel electrode 221. In an embodiment, the pixel defining layer 215 includes an opening exposing an upper surface of the pixel electrode 221 but covers edges of the pixel electrode 221. In an embodiment, the pixel defining layer 215 may include an organic insulating material. In another embodiment, the pixel defining layer 215 may include an inorganic insulating material, such as silicon nitride, silicon oxynitride, or silicon oxide. In another embodiment, the pixel defining layer 215 may include an organic insulating material and an inorganic insulating material.

An intermediate layer 222 includes an emission layer 222b. The intermediate layer 222 may include a first functional layer 222a under the emission layer 222b and/or a second functional layer 222c on the emission layer 222b. The emission layer 222b may include a polymer or low-molecular weight organic material emitting light of a certain color (e.g., a predetermined color).

The first functional layer 222a may have a single-layered or multi-layered structure. For example, when the first functional layer 222a includes a polymer organic material, the first functional layer 222a may include a hole transport layer (HTL) having a single-layered structure and may include poly-(3,4)-ethylene-dioxy thiophene (PEDOT) or polyaniline (PANI). When the first functional layer 222a includes a low-molecular weight organic material, the first functional layer 222a may include a hole injection layer (HIL) and an HTL.

The second functional layer 222c is optional. In an embodiment, for example, when the first functional layer 222a and the emission layer 222b include a polymer organic material, the second functional layer 222c may be formed. The second functional layer 222c may have a single-layered or multi-layered structure. In an embodiment, the second functional layer 222c may include an electron transport layer (ETL) and/or an electron injection layer (EIL).

The emission layer 222b of the intermediate layer 222 may be in every pixel of the display area DA. The emission layer 222b may be patterned to correspond to the pixel electrode 221. In an embodiment, unlike the emission layer 222b, the first functional layer 222a and/or the second functional layer 222c in the intermediate layer 222 may be integrally provided on the substrate 100 to be in the middle area MA as well as the display area DA.

The opposite electrode 223 may include a conductive material having a low work function. In an embodiment, for example, the opposite electrode 223 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another embodiment, the opposite electrode 223 may further include a layer including ITO, IZO, ZnO, or $In_2O_3$ on the (semi-)transparent layer including the above material. In an embodiment, the opposite electrode 223 may be integrally provided on the middle area MA, as well as the display area DA. In an embodiment, the first functional layer 222a, the second functional layer 222c, and the opposite electrode 223 may be manufactured by a thermal evaporation method.

In an embodiment, a capping layer 230 may be located on the opposite electrode 223. For example, the capping layer 230 may include a LiF layer and may be formed by a thermal evaporation method. In some embodiments, the capping layer 230 may be omitted.

In an embodiment, a spacer 217 may be formed on the pixel defining layer 215 and may include an organic insulating material, such as polyimide. In another embodiment, the spacer 217 may include an inorganic insulating material, or an organic insulating material and an inorganic insulating material.

The spacer 217 may include a material that is different from or the same as that of the pixel defining layer 215. In an embodiment, the pixel defining layer 215 and the spacer 217 may include polyimide. In an embodiment, the pixel defining layer 215 and the spacer 217 may be manufactured together through a mask process using a half-tone mask.

The organic light-emitting diode OLED may be covered by a thin film encapsulation layer 300. In an embodiment, the thin film encapsulation layer 300 may include at least one organic encapsulation layer and at least one inorganic encapsulation layer, and FIG. 8 shows that the thin film encapsulation layer 300 includes first and second inorganic encapsulation layers 310 and 330 and an organic encapsulation layer 320 between the first and second inorganic encapsulation layers 310 and 330. In another embodiment, a stacking order and the number of organic and inorganic encapsulation layers may vary.

In an embodiment, the first and second inorganic encapsulation layers 310 and 330 may include one or more inorganic materials from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layered structure or a multi-layered structure including the above-mentioned materials. In an embodiment, the organic encapsulation layer 320 may include a polymer-based material and may include an acryl-based resin, such as polymethacrylate and polyacrylic acid, an epoxy-based resin, polyimide, polyethylene, etc. In an embodiment, the organic encapsulation layer 320 may include an acrylate polymer.

Materials included in the first inorganic encapsulation layer 310 and the second inorganic encapsulation layer 330 may be different from each other. For example, the first inorganic encapsulation layer 310 may include silicon oxynitride and the second inorganic encapsulation layer 330 may include silicon nitride. The first inorganic encapsulation layer 310 and the second inorganic encapsulation layer 330 may have different thicknesses. In an embodiment, the thickness of the first inorganic encapsulation layer 310 may be greater than that of the second inorganic encapsulation layer 330. In another embodiment, the thickness of the second inorganic encapsulation layer 330 may be greater than that of the first inorganic encapsulation layer 310, or the first inorganic encapsulation layer 310 and the second inorganic encapsulation layer 330 may have a same thickness.

Referring to the middle area MA of FIG. 8, one or more grooves G may be in the middle area MA. The organic material layer included in the intermediate layer 222, e.g., the first functional layer 222a and/or the second functional layer 222c, may be disconnected (or isolated) by the groove G.

In an embodiment, the groove G may be in a first layer 240 and a second layer 250 that include different materials from each other. In an embodiment, the first layer 240 may include an organic insulating material, and the second layer 250 may include an inorganic insulating material or a metal. In an embodiment, the second layer 250 may include a metal.

Referring to FIGS. 9 and 10, the first layer 240 may be on the second interlayer insulating layer 207 that is an inorganic insulating layer, and the second layer 250 may be on an upper surface of the first layer 240. A thickness T of the first layer 240 may be greater than a thickness t of the second layer 250.

The first layer 240 may include an organic insulating material, such as any of a general polymer, polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. In some embodiments, the first layer 240 may be formed before forming the first organic insulating layer 209, for example, in a process of forming an organic material layer that will be described later with reference to FIG. 11.

The second layer 250 may be in direct contact with the upper surface of the first layer 240 and may include a metal. In an embodiment, the second layer 250 may include molybdenum (Mo), aluminum (Al), copper (Cu), titanium (Ti), etc., and may have a single-layered or multi-layered structure including the materials described above. In some embodiments, the second layer 250 may include a material that is the same as that included in the data line DL, or the source electrode SE or the drain electrode DE of the thin film transistor TFT.

The groove G may have an undercut structure or an eave structure. The groove G may include a second hole 250h in the second layer 250 and a first hole 240h in the first layer 240. In an embodiment, the groove G may be manufactured through an etching (e.g., an isotropic etching) process. According to an etched degree, the groove G including the second hole 250h in the second layer 250 and the first hole 240h in the first layer 240 is formed as shown in FIG. 9, or the groove G including the second hole 250h in the second layer 250 and a recess 240r in the first layer 240 may be formed as shown in FIG. 10. When the first layer 240 includes the recess 240r, a depth d of the recess 240r may be less than the thickness T of the first layer 240. In some embodiments, the depth d of the recess 240r may be about 3 μm or greater.

In an embodiment, a bottom surface of the groove G may be flush with a bottom surface of the first layer 240 or an upper surface of the second interlayer insulating layer 207, as shown in FIG. 9. In another embodiment, the bottom surface of the groove G may be between the upper surface and the bottom surface of the first layer 240, as shown in FIG. 10, or between the upper surface of the first layer 240 and the upper surface of the second interlayer insulating layer 207.

An end portion of the second layer 250, which defines the second hole 250h, may further extend towards the center of the second hole 250h as compared with an internal surface of the first layer 240, which defines the first hole 240h or the recess 240r. For example, the second layer 250 may include a tip 251, or a pair of tips 251 when viewed in a cross-section, that defines the second hole 250h and extend towards the center of the second hole 250h further than the internal surface of the first layer 240.

Each of the tips 251 may have a first width W1, and, in an embodiment, the first width W1 may be about 2 μm or greater. The first width W1 of the tip 251 may correspond to a distance from an edge of the upper surface of the first layer 240 that is right under the tip 251 to an edge of the tip 251 in a horizontal direction.

The groove G having the above structure may be manufactured before forming the intermediate layer 222. From among layers on the substrate 100, a layer including an organic material may be a path through which moisture proceeds. For example, as shown in FIG. 8, when the display panel 10 includes the first through hole 10H, the moisture may proceed in a direction in parallel with the upper surface of the substrate 100 (herein, referred to as a lateral direction), but according to an embodiment, the organic material layer, e.g., the first functional layer 222a and/or the second functional layer 222c, may be disconnected or isolated due to the eave or undercut structure of the groove G. In an embodiment, the first functional layer 222a and/or the second functional layer 222c may be manufactured by a thermal evaporation method, and the first functional layer 222a and/or the second functional layer 222c may be discontinuously formed due to the structure of the tips 251 when depositing the first functional layer 222a and/or the second functional layer 222c.

Similarly, the opposite electrode 223 and/or the capping layer 230 may be formed by a thermal evaporation method and may have a discontinuous structure due to the structure of the tips 251. In an embodiment, FIGS. 8, 9, and 10 show a structure in which the first functional layer 222a, the second functional layer 222c, the opposite electrode 223, and the capping layer 230 are disconnected at the tips 251. In an embodiment, some parts of the first functional layer 222a, the second functional layer 222c, the opposite electrode 223, and the capping layer 230 may be in the bottom surface of the groove G.

In an embodiment, a barrier wall PW may be between the grooves G. In an embodiment, the barrier wall PW may include a plurality of barrier wall layers that are sequentially stacked. In an embodiment, the barrier wall PW may include a first barrier wall layer PW1, a second barrier wall layer PW2, and a third barrier wall layer PW3, as shown in FIG. 8. The first barrier wall layer PW1 may include a same material as that of the first organic insulating layer 209, the second barrier wall layer PW2 may include a same material as that of the second organic insulating layer 211, and the third barrier wall layer PW3 may include a same material as that of the pixel defining layer 215 and/or the spacer 217.

The barrier wall PW may be apart from the first layer 240. For example, the first barrier wall layer PW1, the second barrier wall layer PW2, and the third barrier wall layer PW3 may be apart from the first layer 240. Between the barrier wall PW and the first layer 240, the second layer 250 may be in direct contact with the inorganic insulating layer under the first layer 240, e.g., the second interlayer insulating layer 207, beyond the first layer 240. The second layer 250 may be in direct contact with the upper surface of the second interlayer insulating layer 207 beyond an outer side surface of the first layer 240.

In a comparative example, when a layer included in the barrier wall PW is in contact with the first layer 240, an organic material path through which the moisture proceeds may be formed. However, according to embodiments, the layers included in the barrier wall PW and the first layer 240 are apart from each other, and/or the second interlayer insulating layer 207, that is, the inorganic insulating layer, and the second layer 250 including a metal are in direct contact with each other, and, thus, a proceeding path of moisture may be blocked.

Like the groove G described above with reference to FIG. 7 having a loop shape surrounding the first through hole 10H, a stack structure including the first layer 240 and the second layer 250, in which the groove G is defined, may have a loop shape surrounding the first through hole 10H in a plan view. Similarly, the barrier wall PW may also have a loop shape surrounding the first through hole 10H in a plan view. The first layer 240 and the barrier wall PW defining one groove G and the first layer 240 defining the other groove G may have loop shapes that surround the first through hole 10H while being spaced apart or separated from each other.

The thin film encapsulation layer 300 may also be in the middle area MA. The first inorganic encapsulation layer 310 may have a relatively excellent step coverage, as compared with the first functional layer 222a, the second functional layer 222c, the opposite electrode 223, and/or the capping layer 230. The first inorganic encapsulation layer 310 may be continuous as shown in FIG. 8. For example, the first inorganic encapsulation layer 310 may continuously and entirely cover an inner surface of the groove G. In an embodiment, the first inorganic encapsulation layer 310 may be formed by a chemical vapor deposition method.

In an embodiment, the organic encapsulation layer 320 may overlap the groove G that is closest to the display area DA among the grooves G. The groove G closest to the display area DA may be at least partially filled with a material included in the organic encapsulation layer 320.

Since the second inorganic encapsulation layer 330 has a relatively excellent step coverage similarly to the first inorganic encapsulation layer 310, the second inorganic encapsulation layer 330 may continuously cover a part of the grooves G, for example, an internal surface of the groove G between the barrier wall PW and the first through hole 10H.

The input sensing section 40 may be on the display panel 10 that includes the substrate 100, the display layer 200 including the pixel circuit PC and the organic light-emitting diode OLED on the substrate 100, and the thin film encapsulation layer 300. In an embodiment, the input sensing section 40 may be directly on the display panel 10.

In an embodiment, the input sensing section 40 may include a first insulating layer 410, a second insulating layer 420, a third insulating layer 440, and a fourth insulating layer 460 that are sequentially stacked. The input sensing section 40 may include a first conductive layer 430 between the second insulating layer 420 and the third insulating layer 440, and a second conductive layer 450 between the third insulating layer 440 and the fourth insulating layer 460. The first conductive layer 430 and/or the second conductive layer 450 may include touch electrodes for sensing a touch input, and trace lines connected to the touch electrodes.

In an embodiment, the first insulating layer 410, the second insulating layer 420, or the third insulating layer 440 may include an inorganic insulating material, such as silicon oxide, silicon nitride, or silicon oxynitride, and the fourth insulating layer 460 may include an organic insulating material. For example, the organic insulating material in the fourth insulating layer 460 may include photoresist (negative or positive) or a polymer-based organic material. The first conductive layer 430 and/or the second conductive layer 450 may include a metal or a transparent conductive oxide (TCO). In some embodiments, the first conductive layer 430 and/or the second conductive layer 450 may include a conductive material including any of molybdenum (Mo), aluminum (Al), copper (Cu), titanium (Ti), etc.

In an embodiment, the first insulating layer 410, the second insulating layer 420, the third insulating layer 440, and the fourth insulating layer 460 may be integrally provided in the display area DA and the middle area MA. Unlike the above layers, a planarization layer 415 may be in the middle area MA. In a plan view, the planarization layer 415 may have a loop shape around (e.g., surrounding) the first through hole 10H.

The planarization layer 415 may include an organic insulating layer. In an embodiment, the planarization layer 415 may include a polymer-based material. For example, the planarization layer 415 may include a silicon-based resin, an acryl-based resin, an epoxy-based resin, polyimide, polyethylene, etc. The planarization layer 415 may include a material different from that included in the organic encapsulation layer 320.

A part of the planarization layer 415, which is neighboring with the display area DA, may overlap the organic encapsulation layer 320. The second inorganic encapsulation layer 330 and the first insulating layer 410 may be between the organic encapsulation layer 320 and the planarization layer 415 overlapping each other.

The organic encapsulation layer 320 is at a side of the barrier wall PW, and in the middle area MA, a region that is not covered by the organic encapsulation layer 320 may be covered by the planarization layer 415. Since the planarization layer 415 is in the region of the middle area MA, which is not covered by the organic encapsulation layer 320, the flatness of the display panel 10 around the first through hole 10H may be increased. Therefore, exfoliation of the input sensing section 40 and/or the optical functional section 50 (see FIG. 2) on the display panel 10 may be prevented or substantially prevented.

Figure 11:
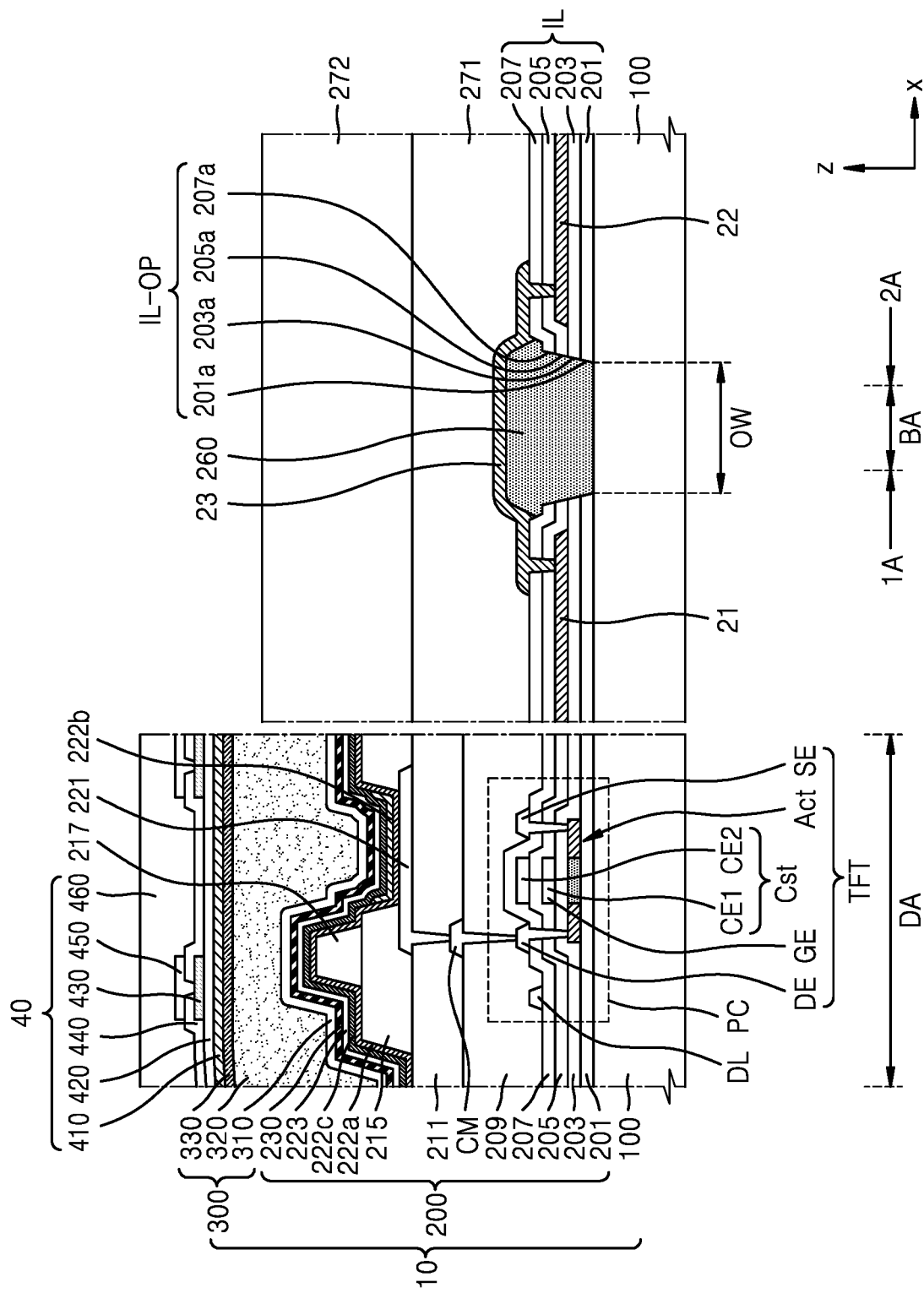
FIG. 11 is a cross-sectional view of a display panel according to an embodiment.

FIG. 11 is a cross-sectional view of the display panel 10 according to an embodiment.

The display area DA of FIG. 11 may have a same stack structure as that of the display area DA described above with reference to FIG. 10, and further descriptions thereof may be omitted. The display panel 10 may include the bending area BA in an outer region thereof, as described above with reference to FIGS. 4 and 5.

Referring to the peripheral area PA including the bending area BA shown in FIG. 11, an inorganic insulating structure IL on the substrate 100 may include an opening IL-OP. The inorganic insulating structure IL may include at least one inorganic insulating layer. In some embodiments, the inorganic insulating structure IL may include a buffer layer 201, a gate insulating layer 203, a first interlayer insulating layer 205, and/or a second interlayer insulating layer 207. An opening 201a of the buffer layer 201, an opening 203a of the gate insulating layer 203, an opening 205a of the first interlayer insulating layer 205, and/or an opening 207a of the second interlayer insulating layer 207 overlap one another and form the opening IL-OP of the inorganic insulating structure IL. In an embodiment, a width OW of the opening IL-OP may be greater than that of the bending area BA. In some embodiments, when the substrate 100 includes two base layers and an inorganic insulating layer on each base layer, an inorganic insulating layer at the uppermost layer of the substrate 100 may also include an opening corresponding to the opening IL-OP. In this case, the base layer of the substrate 100 may be exposed through the opening IL-OP, and the exposed portion of the base layer may be in direct contact with an organic insulating layer 260 that will be described later.

The organic insulating layer 260 may be in the bending area BA. The organic insulating layer 260 may at least partially fill an opening of at least one inorganic insulating layer. For example, the organic insulating layer 260 may at least partially fill the opening IL-OP of the inorganic insulating structure IL. In an embodiment, the organic insulating layer 260 may be only in the bending area BA. The organic insulating layer 260 may include an organic insulating material, such as acryl, benzocyclobutene (BCB), polyimide, hexamethyldisiloxane (HMDSO), etc. In an embodiment, the organic insulating layer 260 may be manufactured in a same process as that of the first layer 240 (see FIG. 8) described above with reference to FIG. 8, and may include a same material as that of the first layer 240.

The inorganic insulating structure IL includes the opening IL-OP in the bending area BA, and generation of cracks in at least one inorganic insulating layer due to bending stress may be prevented or reduced. In addition, since the organic insulating layer 260 may absorb the stress generated in bending, the issue of crack generation may be prevented or reduced.

The first portion 21 of the line in the first area 1A and the second portion 22 of the line in the second area 2A may be apart from each other about the bending area BA. In an embodiment, the first portion 21 and the second portion 22 may be on, for example, the gate insulating layer 203. In another embodiment, the first portion 21 and/or the second portion 22 may be, for example, on the first interlayer insulating layer 205.

The first portion 21 and the second portion 22 may be electrically connected to each other via the third portion 23 on the organic insulating layer 260. The third portion 23 may extend across the bending area BA. An end portion of the third portion 23 may be connected to the first portion 21 via a contact hole that penetrates through the first and second interlayer insulating layers 205 and 207 while overlapping the first portion 21. The other end portion of the third portion 23 may be connected to the second portion 22 via a contact hole that penetrates through the first and second interlayer insulating layers 205 and 207 while overlapping the second portion 22.

The third portion 23 may include a material having relatively higher flexibility than that of the first portion 21 and/or the second portion 22, e.g., aluminum. In an embodiment, the third portion 23 may be formed through a same process as that of the second layer 250 (see FIG. 8) described above with reference to FIG. 8, and may include a same material as that of the second layer 250.

In an embodiment, one or more protective layers may be in the peripheral area PA. In an embodiment, FIG. 11 shows a first protective layer 271 and a second protective layer 272. In an embodiment, the first protective layer 271 and the second protective layer 272 may include an organic insulating material. The first protective layer 271 and/or the second protective layer 272 protect the third portion 23 of the line, and may adjust a neutral plane of the display panel or disperse bending stress during bending.

Figure 12:
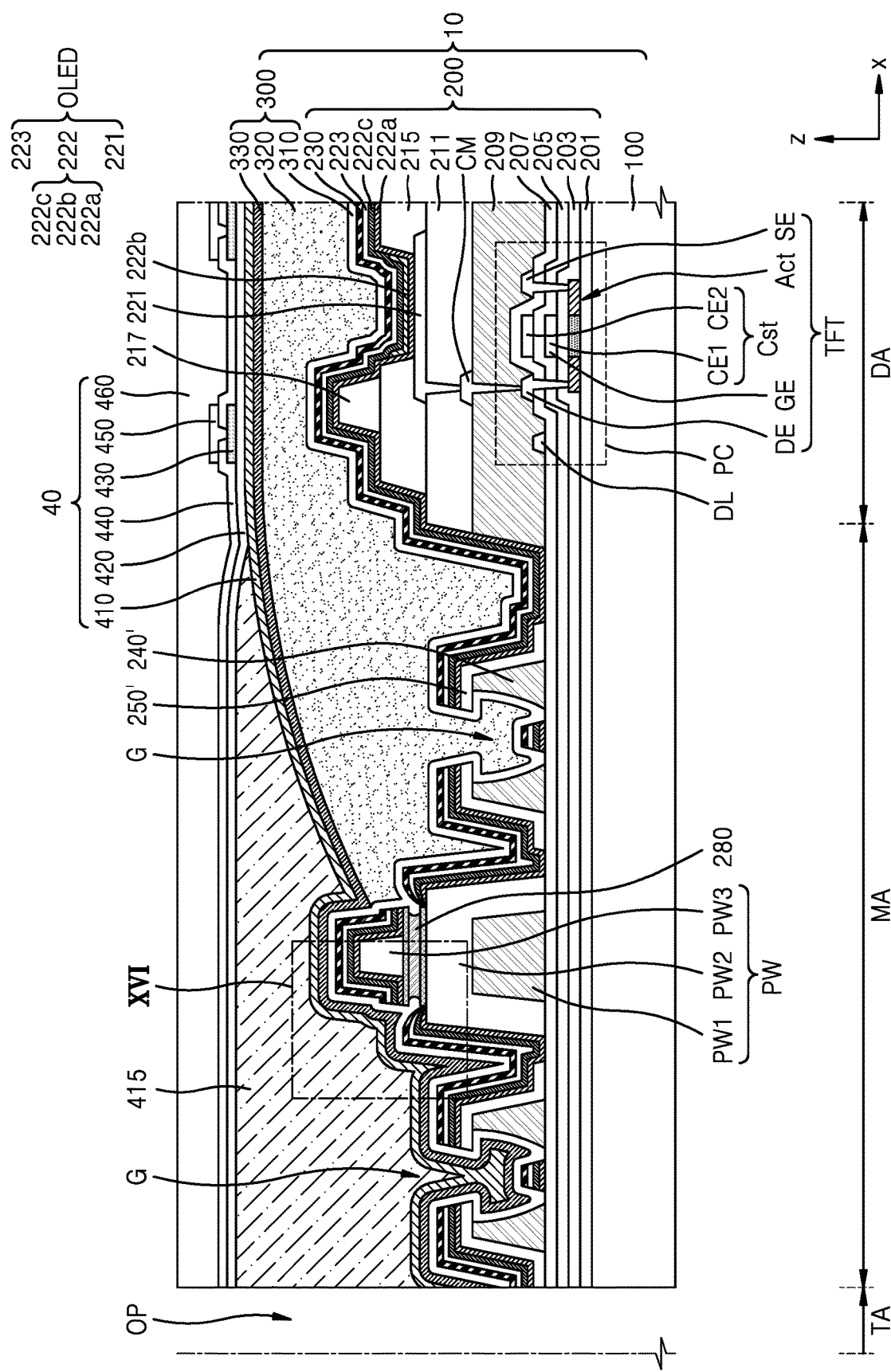
FIG. 12 is a cross-sectional view partially showing a display device according to an embodiment.
Figure 13:
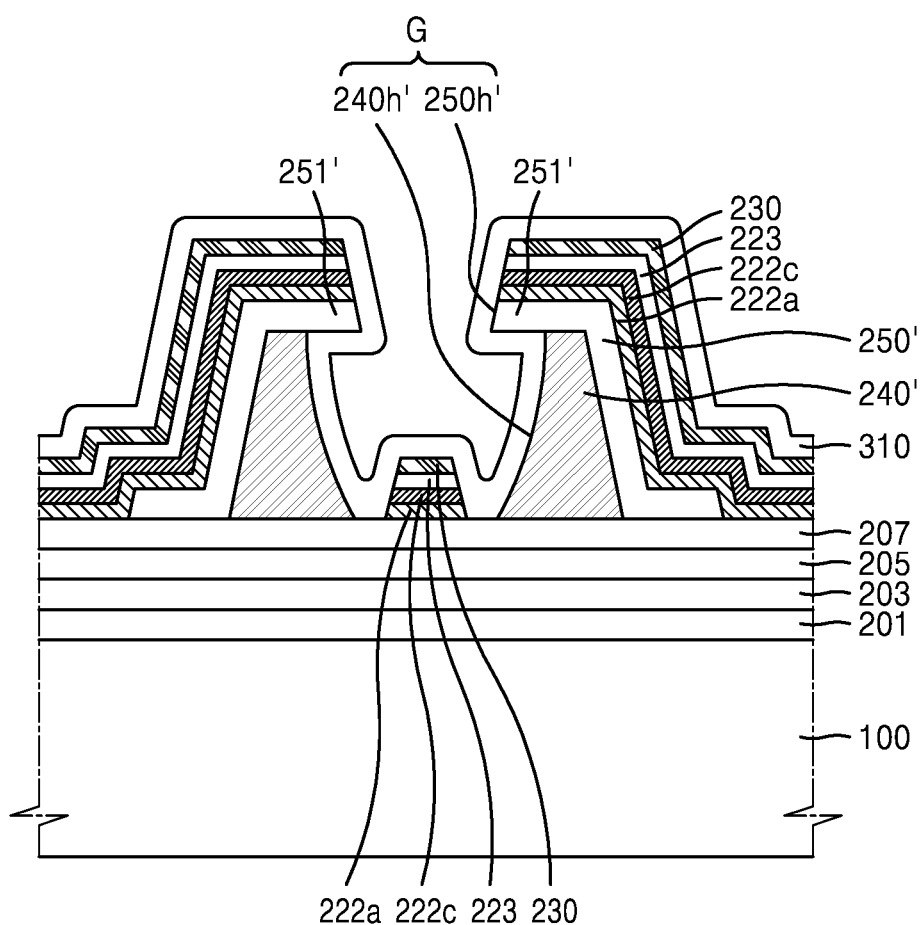
FIGS. 13 to 15 are cross-sectional views showing a groove structure according to some embodiments.
Figure 14:
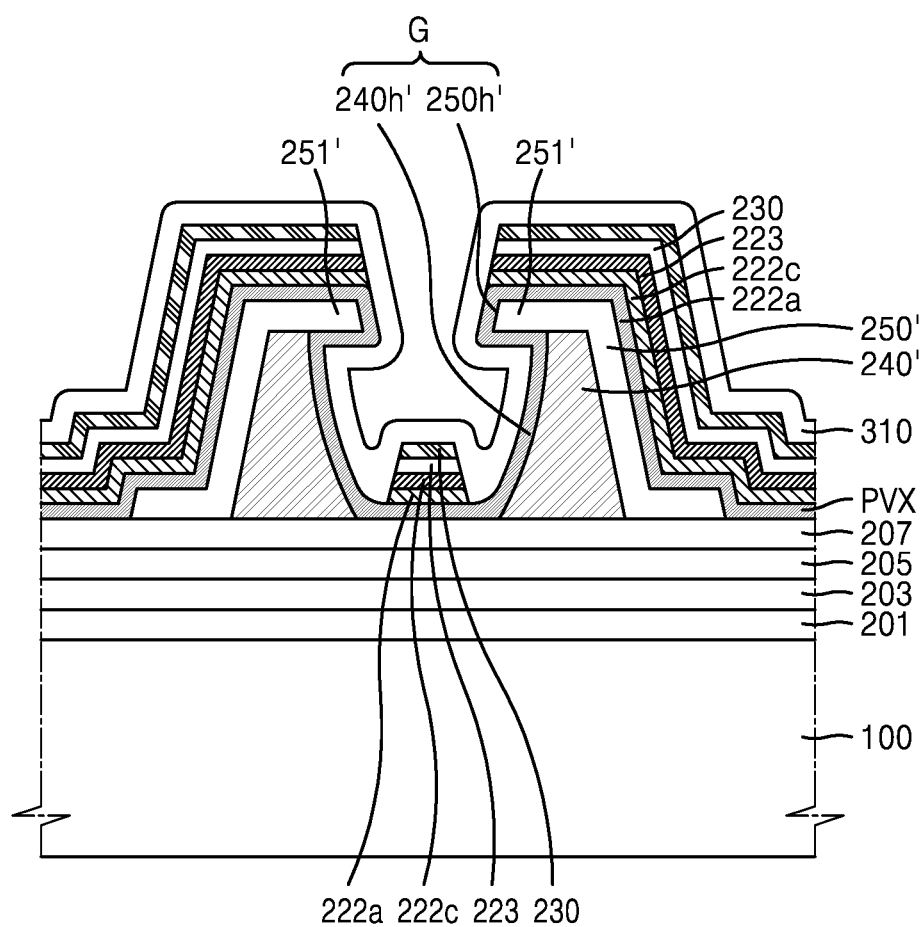
Figure 15:
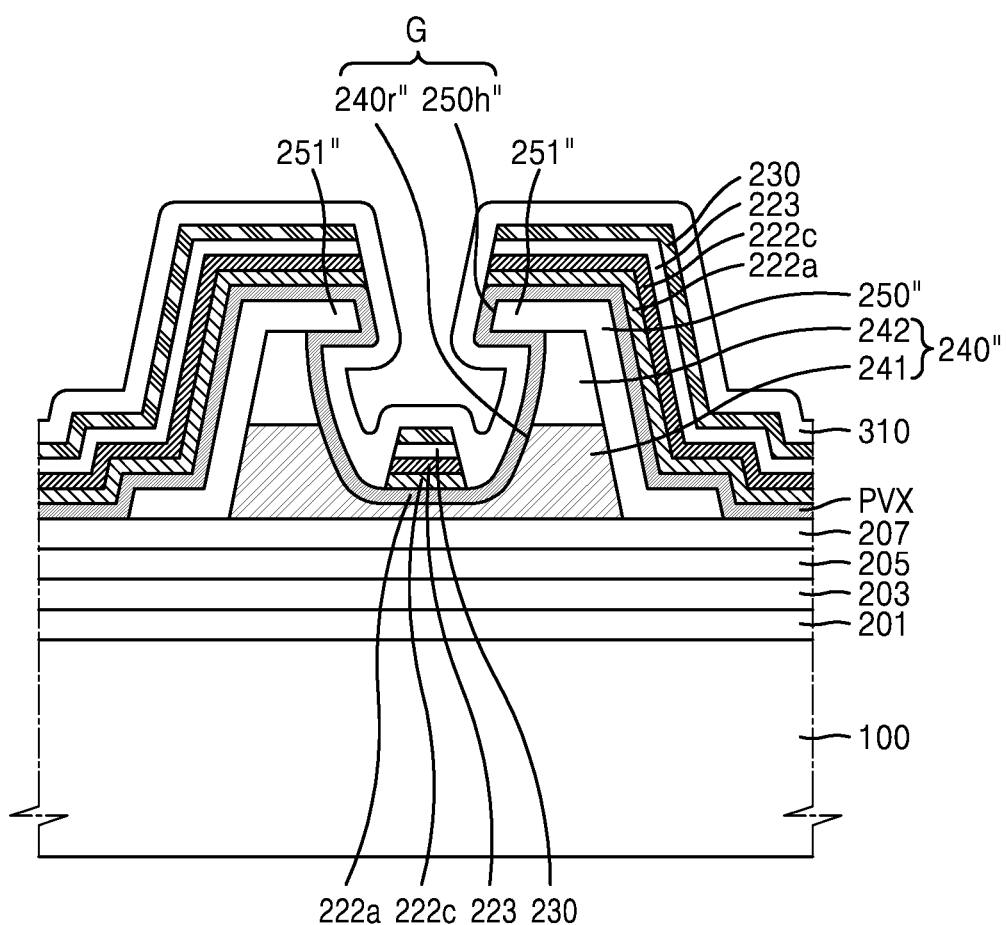
Figure 16:
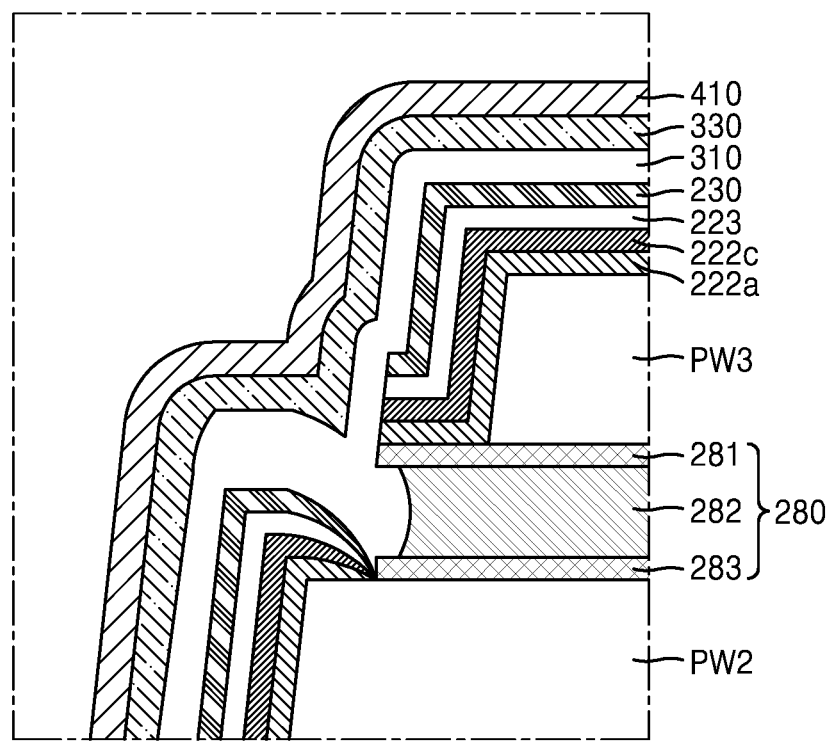
FIG. 16 is an enlarged cross-sectional view of a region XVI of FIG. 12 showing a barrier wall.

FIG. 12 is a cross-sectional view partially showing a display device according to an embodiment; FIGS. 13 to 15 are cross-sectional views of groove structures according to some embodiments; and FIG. 16 is an enlarged cross-sectional view of a region XVI of FIG. 12 showing a barrier wall. FIG. 12 shows the display panel and the input sensing section with the optical functional section omitted in the display device, for convenience of description.

Referring to the display area DA of FIG. 12, the display area DA of FIG. 12 may have a same stack structure as that of the display area DA described above with reference to FIG. 10, and further descriptions thereof may be omitted.

Referring to the middle area MA of FIG. 12, the groove G may be in a first layer 240' and a second layer 250'. Referring to FIGS. 12 and 13, the first layer 240' may be on the second interlayer insulating layer 207 that is an inorganic insulating layer, and the second layer 250' may be on an upper surface of the first layer 240'.

In an embodiment, the first layer 240' may include an organic insulating material. In some embodiments, the first layer 240' may be manufactured through a same process as that of the first organic insulating layer 209 shown in FIG. 12, and may include a same material as that of the first organic insulating layer 209.

In an embodiment, the second layer 250' may be in direct contact with the upper surface of the first layer 240' and may include a metal. In an embodiment, the second layer 250' may be formed in a same process as that of the contact metal layer CM shown in FIG. 12, and may include a same material as that of the contact metal layer CM.

In an embodiment, the groove G may have an undercut structure or an eave structure. The groove G may include a second hole 250h' in the second layer 250' and a first hole 240h' in the first layer 240'. The groove G may be formed by an etching (e.g., an isotropic etching) process, and FIGS. 12 and 13 show that the second hole 250h' in the second layer 250' and the first hole 240h' in the first layer 240' define the groove G. In another embodiment, as described above with reference to FIG. 10, a recess, instead of the first hole 240h', may be in the first layer 240'.

An end portion of the second layer 250', which defines the second hole 250h', may further extend towards the center of the second hole 250h' as compared with an internal surface of the first layer 240', which defines the first hole 240h' or the recess, to form a tip, or a pair of tips 251' in a cross-sectional view. As described above, the organic material layer in the intermediate layer 222, e.g., the first functional layer 222a and/or the second functional layer 222c, may be isolated or disconnected due to the tips 251'. Similarly, the opposite electrode 223 and/or the capping layer 230 may be isolated or disconnected due to the undercut or eave structure.

The thin film encapsulation layer 300 may include the first inorganic encapsulation layer 310, the organic encapsulation layer 320, and the second inorganic encapsulation layer 330. Since the first inorganic encapsulation layer 310 has a relatively excellent step coverage, as shown in FIGS. 12 and 13, the first inorganic encapsulation layer 310 may continuously cover an internal surface of the groove G. A structure of the thin film encapsulation layer 300 and a structure of the input sensing section 40 on the thin film encapsulation layer 300 may be the same as those described above with reference to FIG. 8.

FIGS. 12 and 13 show that the internal surface of the groove G, for example, side surfaces and bottom surfaces of the tips 251' and the internal side surface of the first layer 240' are in direct contact with the first inorganic encapsulation layer 310. In some embodiments, an inorganic passivation layer PVX may be between the internal surface of the groove G and the first inorganic encapsulation layer 310.

Referring to FIG. 14, the inorganic passivation layer PVX may be on the second layer 250'. For example, the inorganic passivation layer PVX may be formed after forming the second layer 250' and before forming the intermediate layer 222 (see FIG. 8). Although not shown in the drawings, the inorganic passivation layer PVX may extend to the display area DA (see FIG. 8), and, in this case, the inorganic passivation layer PVX may be between the contact metal layer CM (see FIG. 12) and the second organic insulating layer 211 in the display area DA.

The inorganic passivation layer PVX may include an inorganic insulating material, such as silicon oxide, silicon nitride, and silicon oxynitride. The inorganic passivation layer PVX may be obtained by a chemical vapor deposition method, etc.

In an embodiment, the inorganic passivation layer PVX may continuously and entirely cover the internal surface of the groove G. For example, the inorganic passivation layer PVX may cover an upper surface, a side surface, and a bottom surface of the second layer 250' and may continuously cover the internal surface of the first layer 240' and an upper surface of the second interlayer insulating layer 207 under the first layer 240'.

After forming the inorganic passivation layer PVX, the first functional layer 222a, the second functional layer 222c, the opposite electrode 223, and/or the capping layer 230 may be formed. The first functional layer 222a, the second functional layer 222c, the opposite electrode 223, and/or the capping layer 230 may be disconnected or isolated at the pair of tips 251'.

In an embodiment, the first inorganic encapsulation layer 310 formed after the capping layer 230 continuously covers the internal surface of the groove G, and may be in direct contact with the inorganic passivation layer PVX at some regions.

FIG. 14 shows that the first layer 240' has a single-layered structure, but, in some embodiments, the first layer 240' may include a plurality of layers.

Referring to FIG. 15, in an embodiment, a first layer 240" may include a first sub-layer 241 and a second sub-layer 242. In an embodiment, the first sub-layer 241 may include a same material as that of the first organic insulating layer 209 described above with reference to FIG. 12, and the second sub-layer 242 may include a same material as that of the second organic insulating layer 211. In another embodiment, the first sub-layer 241 may include a same material as that of the organic insulating layer 260 described above with reference to FIG. 11, and the second sub-layer 242 may include a same material as that of the first organic insulating layer 209.

The second layer 250" may include a metal or an inorganic insulating material. A second hole 250h" of the second layer 250" and a first hole or a recess 240r" of the first layer 240" may define the groove G. The second layer 250" may include a tip, or a pair of tips 251" in a cross-sectional view, protruding towards a center of the second hole 250h". The pair of tips 251" may further protrude towards the center of the second hole 250h" as compared with the internal surface of the first layer 240", to form an undercut structure or an eave structure.

As described above with reference to FIG. 14, the inorganic passivation layer PVX may be on the second layer 250", and the first functional layer 222a, the second functional layer 222c, the opposite electrode 223, and/or the capping layer 230 may be disconnected or isolated at the pair of tips 251".

In an embodiment, the inorganic passivation layer PVX may continuously cover the internal surface of the groove G, and the first inorganic encapsulation layer 310 may be partially in direct contact with the inorganic passivation layer PVX, as described above. In another embodiment, the inorganic passivation layer PVX may be omitted.

Referring back to FIG. 12, the barrier wall PW may be among a plurality of grooves G. The barrier wall PW may include a plurality of barrier wall layers, for example, a first barrier wall layer PW1, a second barrier wall layer PW2, and a third barrier wall layer PW3. In an embodiment, the first barrier wall layer PW1 may include a same material as that of the first organic insulating layer 209, the second barrier wall layer PW2 may include a same material as that of the second organic insulating layer 211, and the third barrier wall layer PW3 may include a same material as that of the pixel defining layer 215 and/or the spacer 217.

A gap layer 280 including a metal may be between neighboring barrier wall layers from among the barrier wall layers, for example, between the second barrier wall layer PW2 and the third barrier wall layer PW3. The gap layer 280 may have a fine undercut structure, and, in some embodiments, the first functional layer 222a and/or the second functional layer 222c may be disconnected or isolated. Similarly, the opposite electrode 223 and/or the capping layer 230 may be disconnected or isolated.

Referring to FIGS. 12 and 16, the gap layer 280 may include a metal. In an embodiment, the gap layer 280 may include at least two layers having different etch selectivity ratios from each other. In an embodiment, the gap layer 280 may include a first layer 281, a second layer 282, and a third layer 283. In an embodiment, the first layer 281 and the third layer 283 may have a same material as each other, and the second layer 282 may have a different material from that of the first and third layers 281 and 283. In an embodiment, the first layer 281 and the third layer 283 may include a transparent conductive oxide material, such as ITO, and the second layer 282 may include a metal including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the second layer 282 may have a thickness that is greater than that of the first layer 281 and that of the third layer 283.

In an embodiment, during a process of manufacturing the display panel 10 (see FIG. 12), an edge of the gap layer 280 may be etched, and the second layer 282 may be further etched than the first and third layers 281 and 283. In this case, the edge of the first layer 281 may protrude more than the edge of the second layer 282 in a lateral direction, and the edge of the first layer 281 may perform substantially a same function as that of the tips in the groove G described above. That is, the edge of the first layer 281 protrudes more than the edge of the second layer 282, and then the gap layer 280 may have an undercut structure or an eave structure.

When the sum of thicknesses of the first functional layer 222a, the second functional layer 222c, and the opposite electrode 223, or the sum of thicknesses of the first functional layer 222a, the second functional layer 222c, and the capping layer 230 is less than a thickness of the gap layer 280, the first functional layer 222a, the second functional layer 222c, the opposite electrode 223, and/or the capping layer 230 may be disconnected or isolated. In this regard, FIG. 16 shows that the first functional layer 222a, the second functional layer 222c, the opposite electrode 223, and the capping layer 230 are disconnected at the edge of the gap layer 280.

The display device according to one or more embodiments may prevent or substantially prevent damage to the light-emitting diode due to moisture introduced through the through hole or the opening, and may simplify processes or reduce costs by using layers included in the display layer.

It is to be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display device comprising:
   a first through hole;
   a plurality of pixels in a display area around the first through hole, the plurality of pixels including two pixels spaced from one another with the first through hole therebetween;
   a first layer in a middle area between the first through hole and the display area, the first layer comprising a first hole or a recess; and
   a second layer on the first layer, the second layer comprising a second hole overlapping the first hole or the recess,
   wherein the second layer comprises a tip extending towards a center of the second hole further than an internal surface of the first layer, the internal surface defining the first hole or the recess,
   each of the plurality of pixels comprises a light-emitting diode comprising a pixel electrode, an opposite electrode, and an intermediate layer between the pixel electrode and the opposite electrode, and
   at least one organic material layer of the intermediate layer is disconnected at the tip.

2. The display device of claim 1, wherein the at least one organic material layer comprises one or more selected from a hole transport layer, a hole injection layer, an electron injection layer, and an electron transport layer.

3. The display device of claim 1, wherein the opposite electrode is disconnected at the tip.

4. The display device of claim 1, wherein the first layer comprises an organic insulating material, and the second layer comprises a metal.

5. The display device of claim 4, further comprising:
   a substrate on which the plurality of pixels is arranged; and
   at least one inorganic insulating layer between the substrate and the pixel electrode.

6. The display device of claim 5, wherein the first layer is on the at least one inorganic insulating layer, and
   the second layer is in direct contact with an upper surface of the at least one inorganic insulating layer beyond the first layer.

7. The display device of claim 5, further comprising at least one organic insulating layer between the at least one inorganic insulating layer and the pixel electrode,
   wherein the first layer comprises a same material as a material included in the at least one organic insulating layer.

8. The display device of claim 5, wherein a portion of the substrate is bent about a bending axis extending along a bending area, and
   the at least one inorganic insulating layer comprises an opening in the bending area.

9. The display device of claim 8, further comprising an organic insulating layer in the opening of the at least one inorganic insulating layer,
   wherein the first layer comprises a same material as a material included in the organic insulating layer.

10. The display device of claim 1, further comprising an inorganic passivation layer on the second layer.

11. The display device of claim 10, wherein the inorganic passivation layer continuously covers a side surface and a bottom surface of the second layer and an internal surface of the first layer.

12. A display device comprising:
    a substrate;
    a display layer on the substrate, the display layer comprising a plurality of pixels;
    a thin film encapsulation layer on the display layer, the thin film encapsulation layer comprising at least one inorganic encapsulation layer and at least one organic encapsulation layer;
    a first through hole between two neighboring pixels from among the plurality of pixels, the first through hole penetrating through the substrate, the display layer, and the thin film encapsulation layer; and
    a first groove around the first through hole, the first groove being defined in a first layer and a second layer on the first layer, wherein the first groove comprises a first hole or a recess in the first layer and a second hole in the second layer, the second layer comprises a tip extending towards a center of the second hole further than an internal surface of the first layer, the internal surface defining the first hole or the recess, and at least one organic material layer in the display layer is disconnected at the first groove.

13. The display device of claim 12, wherein each of the plurality of pixels comprises a light-emitting diode comprising a pixel electrode, an opposite electrode, and an emission layer between the pixel electrode and the opposite electrode, and the at least one organic material layer is between the pixel electrode and the opposite electrode.

14. The display device of claim 13, wherein the at least one organic material layer comprises one or more selected from a hole transport layer, a hole injection layer, an electron injection layer, and an electron transport layer.

15. The display device of claim 13, wherein the display layer comprises at least one inorganic insulating layer between the substrate and the pixel electrode, and the first layer is on the at least one inorganic insulating layer.

16. The display device of claim 15, wherein the first layer comprises an organic insulating material.

17. The display device of claim 16, wherein the second layer is in direct contact with an upper surface of the at least one inorganic insulating layer beyond the first layer.

18. The display device of claim 17, wherein the second layer comprises a metal or an inorganic insulating material.

19. The display device of claim 16, further comprising an inorganic passivation layer on the second layer.

20. The display device of claim 19, wherein the inorganic passivation layer continuously covers a side surface and a bottom surface of the second layer and an internal surface of the first layer.

21. The display device of claim 15, wherein a portion of the substrate is bent about a bending axis extending along a bending area, and the at least one inorganic insulating layer comprises an opening in the bending area.

22. The display device of claim 21, further comprising an organic insulating layer in the opening of the at least one inorganic insulating layer, wherein the first layer comprises a same material as a material included in the organic insulating layer.

23. The display device of claim 12, further comprising:

a second groove around the first through hole; and a barrier wall between the first groove and the second groove.

24. The display device of claim 23, wherein the barrier wall comprises a plurality of barrier wall layers that are stacked, and a gap layer is between two neighboring barrier wall layers among the plurality of barrier wall layers, the gap layer comprising a metal.

25. The display device of claim 24, wherein the gap layer comprises a first layer and a second layer under the first layer, the first layer comprising an edge protruding outward more than an edge of the second layer, and the at least one organic material layer is disconnected at an eave structure formed by the edge of the first layer and the edge of the second layer.

* * * * *